United States Patent
Ang et al.

(10) Patent No.: US 6,297,677 B1
(45) Date of Patent: Oct. 2, 2001

(54) METHOD FOR A DYNAMIC TERMINATION LOGIC DRIVER WITH IMPROVED SLEW RATE CONTROL

(75) Inventors: Michael A. Ang, San Francisco, CA (US); Alexander D. Taylor, Olga, WA (US); Jonathan E. Starr, Cupertino; Sai V. Vishwanthaiah, Sunnyvale, both of CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/398,872

(22) Filed: Sep. 20, 1999

(51) Int. Cl.[7] .................................................. H03K 5/12

(52) U.S. Cl. ............................ 327/170; 327/381; 327/387

(58) Field of Search .............................. 327/83, 170, 538, 327/378, 382, 393, 108, 381, 387

(56) References Cited

U.S. PATENT DOCUMENTS

| | | | |
|---|---|---|---|
| 4,694,205 | 9/1987 | Shu et al. | 327/53 |
| 4,707,620 | 11/1987 | Sullivan et al. | 326/86 |
| 4,719,369 | 1/1988 | Asano et al. | 326/30 |
| 4,743,784 | 5/1988 | Obara et al. | 327/57 |
| 4,804,871 | 2/1989 | Walters, Jr. et al. | 327/54 |
| 4,831,287 | 5/1989 | Golab | 327/55 |
| 4,845,675 | 7/1989 | Krenik et al. | 365/203 |
| 4,855,628 | 8/1989 | Jun | 327/57 |
| 4,931,675 | 6/1990 | Iwata | 327/55 |
| 4,937,479 | 6/1990 | Hoshi | 327/55 |
| 4,959,563 | 9/1990 | Schenck | 326/27 |
| 5,086,271 * | 2/1992 | Haill et al. | 324/158 R |
| 5,134,311 | 7/1992 | Biber et al. | 327/108 |
| 5,138,515 | 8/1992 | Bourgeois | 361/18 |
| 5,162,672 | 11/1992 | McMahan et al. | 326/86 |
| 5,194,765 | 3/1993 | Dunlop et al. | 326/87 |
| 5,231,311 | 7/1993 | Ferry et al. | 307/443 |
| 5,371,420 | 12/1994 | Nakao | 326/27 |
| 5,402,425 | 3/1995 | Bladh | 370/105.3 |
| 5,457,407 | 10/1995 | Shu et al. | 326/30 |
| 5,568,081 | 10/1996 | Lui et al. | 327/380 |
| 5,598,107 | 1/1997 | Cabuk | 326/27 |
| 5,602,494 | 2/1997 | Sunstrom | 326/39 |
| 5,615,161 | 3/1997 | Mu | 365/208 |
| 5,623,216 | 4/1997 | Penza et al. | 326/27 |
| 5,644,252 | 7/1997 | Watarai | 326/27 |
| 5,666,078 | 9/1997 | Lamphier et al. | 327/108 |
| 5,726,583 | 3/1998 | Kaplinsky | 326/30 |
| 5,739,707 | 4/1998 | Barraclough | 327/112 |
| 5,774,403 * | 6/1998 | Clark, II et al. | 365/194 |
| 5,838,177 | 11/1998 | Keeth | 327/108 |
| 5,850,159 | 12/1998 | Chow et al. | 327/394 |

(List continued on next page.)

*Primary Examiner*—Tuan T. Lam
*Assistant Examiner*—Hiep Nguyen
(74) *Attorney, Agent, or Firm*—Skjerven Morrill MacPherson LLP; Margaret M. Kelton

(57) ABSTRACT

A dynamic termination logic driver, one that is capable of launching signals at a driving end of a transmission line and is capable of terminating signals at a receiver end of the transmission line, controls output impedance and includes within the driver an impedance circuit and slew rate control. Accordingly, a desired output impedance can be advantageously established and maintained over a wide range of variations in operating conditions, manufacturing processes and output voltage levels. Such a driver also advantageously limits any crowbar current, thereby reducing the overall power consumption of the driver with little, if any, degradation of driver performance. The driver includes a pull up circuit coupled to receive at least one of a plurality of control codes and the driver also includes a pull down circuit coupled to receive at least one of the plurality of control codes. The output impedance of the driver is further controlled during transitional phases of tuning on and turning off the pull down circuit and the pull up circuit under a plurality of process, voltage and temperature (PVT) conditions.

12 Claims, 18 Drawing Sheets

U.S. PATENT DOCUMENTS

| | | | |
|---|---|---|---|
| 5,852,579 | 12/1998 | Arcoleo et al. | 365/189.05 |
| 5,862,390 | 1/1999 | Ranjan | 395/750.01 |
| 5,877,647 | 3/1999 | Vajapey et al. | 327/391 |
| 5,898,321 | 4/1999 | Ilkbahar et al. | 326/87 |
| 5,929,671 | 7/1999 | Best | 327/132 |
| 6,026,456 | 2/2000 | Ilkbahar | 710/101 |
| 6,047,346 * | 4/2000 | Lau et al. | 710/126 |
| 6,060,907 | 5/2000 | Vishwanthaiah et al. | 326/87 |
| 6,085,033 | 7/2000 | Starr et al. | 395/500.15 |
| 6,118,310 | 9/2000 | Esch, Jr. et al. | 327/108 |

* cited by examiner

METHOD FOR A DYNAMIC TERMINATION LOGIC DRIVER WITH IMPROVED SLEW RATE CONTROL

CROSS-REFERENCE TO RELATED APPLICATIONS

This application relates to co-pending U.S. patent application Ser. No. 09,399,450, filed Sep. 20, 1999, entitled A Method for a Dynamic Termination Logic Driver with Improved Impedance Control and naming Michael A. Ang, Alexander D. Taylor, Jonathan E. Starr, and Sai V. Vishwanthaiah as inventors, the application being incorporated herein by reference in its entirety.

This application relates to co-pending U.S. patent application Ser. No. 09,398,868, filed Sep. 20, 1999, entitled A Dynamic Termination Logic Driver with Improved Impedance Control and naming Michael A. Ang, Alexander D. Taylor, Jonathan E. Starr, and Sai V. Vishwanthaiah as inventors, the application being incorporated herein by reference in its entirety.

This application relates to co-pending U.S. patent application Ser. No. 09,399,453, filed Sep. 20, 1999, entitled A Dynamic Termination Logic Driver with Improved Slew Rate Control and naming Michael A. Ang, Alexander D. Taylor, Jonathan E. Starr, and Sai V. Vishwanthaiah as inventors, the application being incorporated herein by reference in its entirety.

This application relates to co-pending U.S. patent application Ser. No. 09/326,964, filed on Jun. 7, 1999, entitled Output Driver With Improved Impedance Control and naming Michael A. Ang, Alexander D. Taylor, Jonathan E. Starr, and Sai V. Vishwanthaiah as inventors, the application being incorporated herein by reference in its entirety.

This application relates to co-pending U.S. patent application Ser. No. 09/327,220, filed on Jun. 7, 1999, entitled Method For An Output Driver With Improved Impedance Control and naming Michael A. Ang, Alexander D. Taylor, Jonathan E. Starr, and Sai V. Vishwanthaiah as inventors, the application being incorporated herein by reference in its entirety.

This application relates to co-pending U.S. patent application Ser. No. 09/326,909, filed on Jun. 7, 1999, entitled Output Driver With Improved Slew Rate Control and naming Michael A. Ang, Alexander D. Taylor, Jonathan E. Starr, and Sai V. Vishwanthaiah as inventors, the application being incorporated herein by reference in its entirety.

This application relates to co-pending U.S. patent application Ser. No. 09/327,057, filed on Jun. 7, 1999, entitled Method For An Output Driver With Improved Slew Rate Control and naming Michael A. Ang, Alexander D. Taylor, Jonathan E. Starr, and Sai V. Vishwanthaiah as inventors, the application being incorporated herein by reference in its entirety.

BACKGROUND OF THE INVENTION

1. Field of the Invention

The present invention relates to driver circuits and more particularly to driver circuits for use in information processing systems.

2. Description of the Related Art

In computer and information processing systems, various integrated circuit chips must communicate digitally with each other over common buses. The signal frequency at which this communication occurs can limit the performance of the overall system. Thus, the higher the communication frequency, the better. The maximum frequency at which a system communicates is a function not only of the time that it takes for the electromagnetic wavefronts to propagate on the bus from one chip to another, but also of the time required for the signals to settle to levels that can be reliably recognized at the receiving bus nodes as being HIGH or LOW, referred to as the settling time.

There are several factors which affect the settling time of a signal. For example, the "slew rate" of the launched signal, i.e., the rate at which the voltage level of the launched signal changes from one level to another, is one factor which affects the settling time of the signal. The oscillations in the voltage level of the signal (i.e., the "ringing") due to the effects of package inductance, pad capacitance and other "parasitics" is another factor which affects the settling time of the signal. Ringing due to reflections from impedance mismatches within the bus system is another factor which affects the settling time of the signal. The voltage level of the launched signal relative to the overall signal swing (i.e., the difference between high and low voltage levels of the signal) is another factor which affects the settling time of the signal. The effectiveness of the termination of the bus is another factor which affects the settling time of the signal.

The operating characteristics of transistors such as CMOS transistors, from which drivers are typically constructed, change under a variety of conditions, often referred to as process, voltage, temperature (PVT) variations. PVT variations may be conceptualized as a box across which the operating characteristics of the transistors move. One of ordinary skill in the art will appreciate that the three characteristics, process, voltage and temperature can be visualized as a three dimensional graph with a "slow corner" identifying a point when the three characteristics affect operating conditions, and a "fast corner" identifying a point when the three characteristics do not greatly affect operating conditions. For example, the operating characteristics may move from a fastest corner of PVT variations to a slowest corner of PVT variations, and everywhere in between. More specifically, the operating characteristics due to PVT variations may change with variations in manufacturing process as well as with variations in operating conditions such as junction temperature and supply voltage levels. The operating characteristics may also change with variations of voltage differences across the transistor terminals of the driver; the voltage differences may change as the voltage level at the output node of the driver changes.

If inadequate compensation is made for these variations, the output slew rate and output impedance of the driver may vary substantially within a particular driver as well as from driver to driver on a chip.

Another characteristic that is desirable to control within a driver is crowbar current. The crowbar current is the current that flows directly between the supply rails of a driver through the pull up and pull down units of a driver if both units are enabled simultaneously. Having high crowbar current may cause the driver to consume more power than necessary to provide adequate driver performance.

It is known to provide drivers having different termination characteristics. For example, a High Speed Transceiver Logic (HSTL) type driver, may be designed to terminate at the driver end of a transmission line; a Dynamic Termination Logic (DTL) type driver may be designed to terminate at the receiver end of a transmission line. Each of these driver types has characteristics that affect the driver when a particular type is chosen for a design. What is needed is a driver that provides adequate performance under the different characteristics that affect the driver design.

SUMMARY OF THE INVENTION

It has been discovered that a method for a driver may be provided that controls the output slew rate and the output impedance of a driver by including within the driver a circuit which includes an impedance circuit and a slew rate circuit. Accordingly, a desired output slew rate and a desired output impedance can be advantageously established and maintained over a wide range of variations in operating conditions, manufacturing processes, supply voltage levels, and output voltage levels. Such a method also advantageously limits any crowbar current thereby reducing the overall power consumption of the driver with little, if any, degradation of driver performance.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Overview

Figure 1:
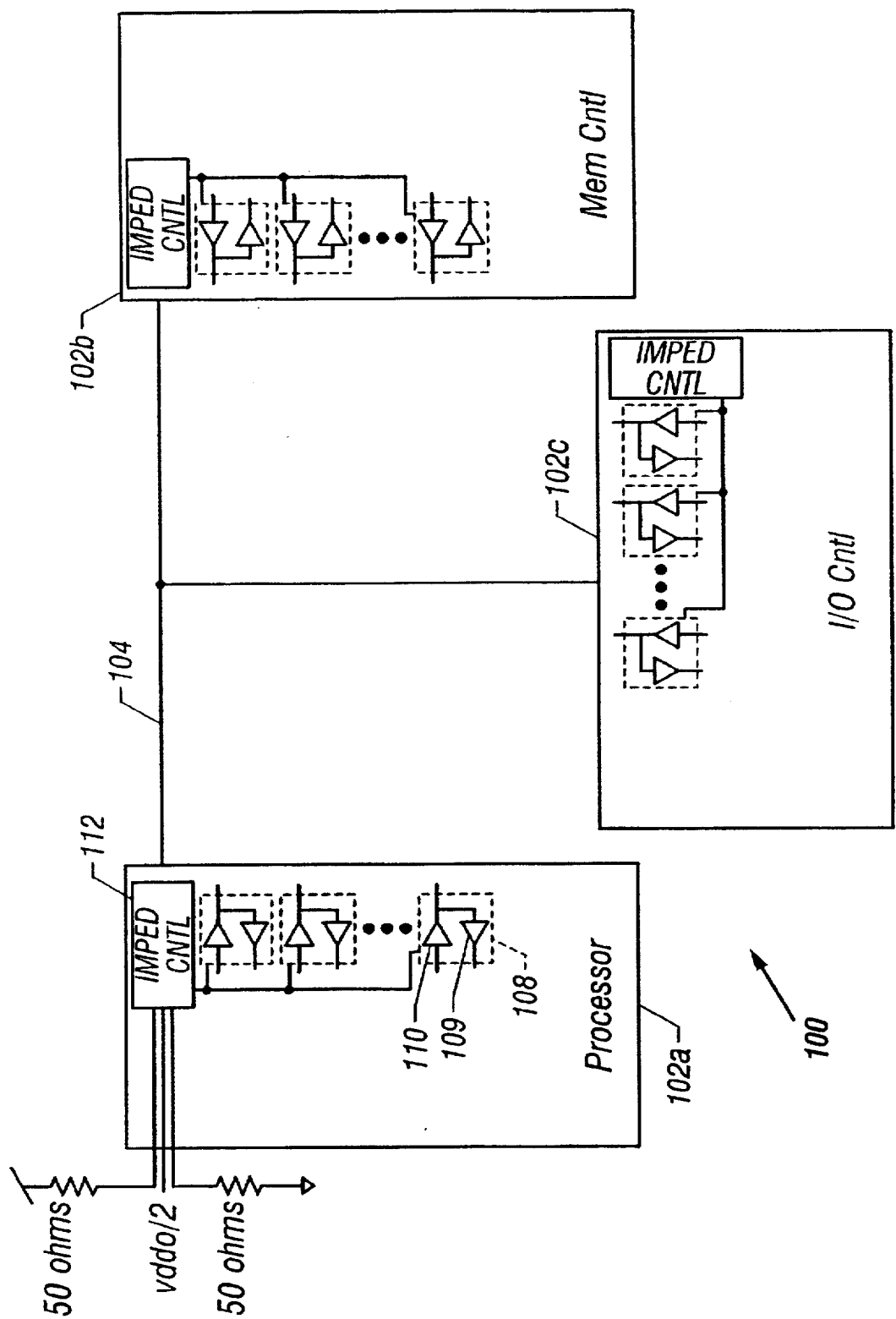
FIG. 1 shows a block diagram of an information handling system having a driver circuit in accordance with the present invention.

Referring to FIG. 1, information handling system 100 includes a plurality of components 102 such as processor 102a, memory controller 102b, and I/O controller 102c. It will be appreciated that these components 102 may be any type of component commonly found in an information handling system. Each of these components 102 is generally configured as an individual integrated circuit chip. However, it is known to combine various components into a single integrated circuit chip. Components 102 are coupled via bus 104. Bus 104 includes a plurality of parallel lines which are coupled to individual signal outputs of each of the components 102.

Each component 102 includes a plurality of circuits 108, including input/output circuits and may include output only circuits. The plurality of circuits 108 are coupled to individual signal paths of bus 104. Each circuit 108 may include a receiver circuit 109 and a driver circuit 110. Component 102 also includes impedance control circuit 112 which may be coupled to each driver circuit 110. Impedance control circuit 112 controls the output impedance of each driver and is appropriate for bus systems that are terminated at the source only and are "open-circuited" at the destination nodes or for bus systems terminated at the destination nodes such as dynamic termination logic bus systems.

In addition to the impedance control circuit 112, as more fully described below, circuitry in the driver circuits 110, including a pull up circuit and a pull down circuit, maintain control over the operating characteristics including output slew rate as well as crowbar current.

In operation, in driver circuits 110, control can be exercised over certain operating characteristics such as output impedance, output slew rate, and "crowbar" current. It is possible to control the output impedance of the driver circuits 110 even though the operating conditions of the transistors inside the driver circuits 110 vary with the manufacturing process, supply voltage, and temperature (PVT) and with changes in the voltages across the terminals of the transistors voltage levels.

One of skill in the art will appreciate that driver circuits 110 are appropriate for bus systems in which, driver circuits 110 send signals onto a transmission line, and there may be either one or more receiving nodes each having a 50-ohm termination resistance or other resistance connected between the line and VDDO. Accordingly the steady-state "high" voltage at the output of the driver circuits 110 is VDDO, and the steady-state "low" voltage will be approximately (within 10% of) VDDO/2. Therefore, for purposes of example only, if there is only one termination resistance, the active driver 110 must be set to have a pull-down resistance of 50 ohms, and, if there are two, the active driver 110 must be set to have a pull-down resistance of 25 ohms. One of ordinary skill in the art appreciates that other termination resistances and transmission line impedances are feasible.

Although the discussion above relates to driver circuits in general, the present invention relates to DTL type drivers. Improved HSTL type drivers are the subject of cross-referenced patent applications Ser. Nos. 09/326,964, 09/327,220, 09/326,909, 09/327,057, filed Jun. 7, 1999, and are incorporated herein in their entireties. Referring now to DTL driver systems, during operation of a DTL system, transient periods occur during which the voltage level at the output node of the driver 110 will go outside of the range stated above, i.e. VDDO and VDDO/2. One of ordinary skill in the art will appreciate that in situations in which the driver 110 is not "tri-stated" (giving a very-high output impedance), the voltages at the output node may range from as low as VSS to as high as 1.25*VDDO, and could reach higher voltages due to "bounce" parasitics. Therefore, the driver 110 operating characteristics, such as output impedance and output slew rate, must be controlled over this range of possible output voltages.

There are significant design differences between HSTL driver systems and DTL driver systems. Much of the functioning of the HSTL driver described in the referenced patent applications is symmetric between pulling high and pulling low. For example, the signal swing is from VSS to VDDO, and signals are launched by the turning on of the appropriate output circuit.

In contrast, the design of the DTL driver system herein is asymmetrical. For example, the signal swing is from VDDO/2 to VDDO, some signals are launched by the turning on of an output, and some signals are launched by the turning off of an output circuit. In addition, when the logic of a bus to driver 110 is low, dc-current flows through the pull down circuit 204 of the driving-end and through the pull up circuit 202 of the receiving end(s). To accommodate these asymmetries between pull up and pull down functions, there are corresponding asymmetries in the design of the overall driver, as described below.

Structure

FIGS. 2–16 portray the basic structural components of the driver circuit 110, including both the pull up circuit 202 and the pull down circuit 204.

Figure 2:
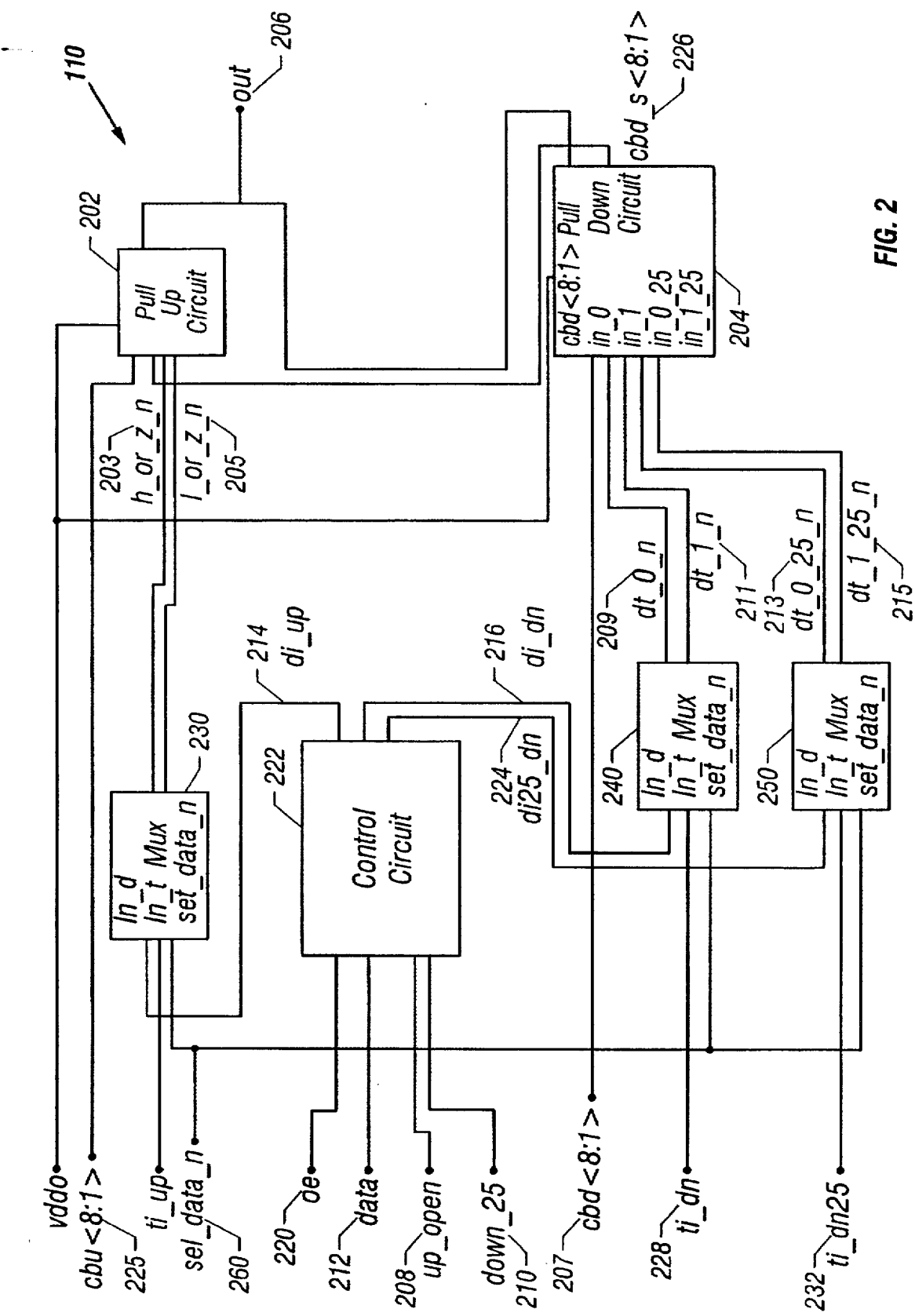
FIG. 2 shows a block diagram of the driver circuit in accordance with the present invention.

Referring to FIG. 2, driver circuit 110 includes pull up circuit 202 and a pull down circuit 204 as well as other components, including control circuit 222, which provides logical outputs di_up 214, di_dn 216, and di25_dn 224. Control circuit 222 receives a data signal 212, an output enable circuit oe 220, an up_open signal 208, and a down_25 210 signal. Each of the pull up circuit 202 and the pull down circuit 204 of driver circuit 110 receives a high voltage input supply (VDDO) and is coupled to a ground reference voltage (not shown). Pull up circuit 202 receives a set of control signals cbu<8:1> 225 and cbd_s<8:1> 226, of which signal set cbu<8:1> 225 is provided by a circuit outside the driver 110 to pull up circuit 202. Pull down circuit 204 also receives a set of control signals cbd<8:1> 207 which is provided by a circuit outside the driver 110 to pull down circuit 204.

Also shown in FIG. 2 are three multiplexor circuits 230, 240, and 250, which provide data signals to the pull down and pull up circuits 204 and 202.

Figure 3:
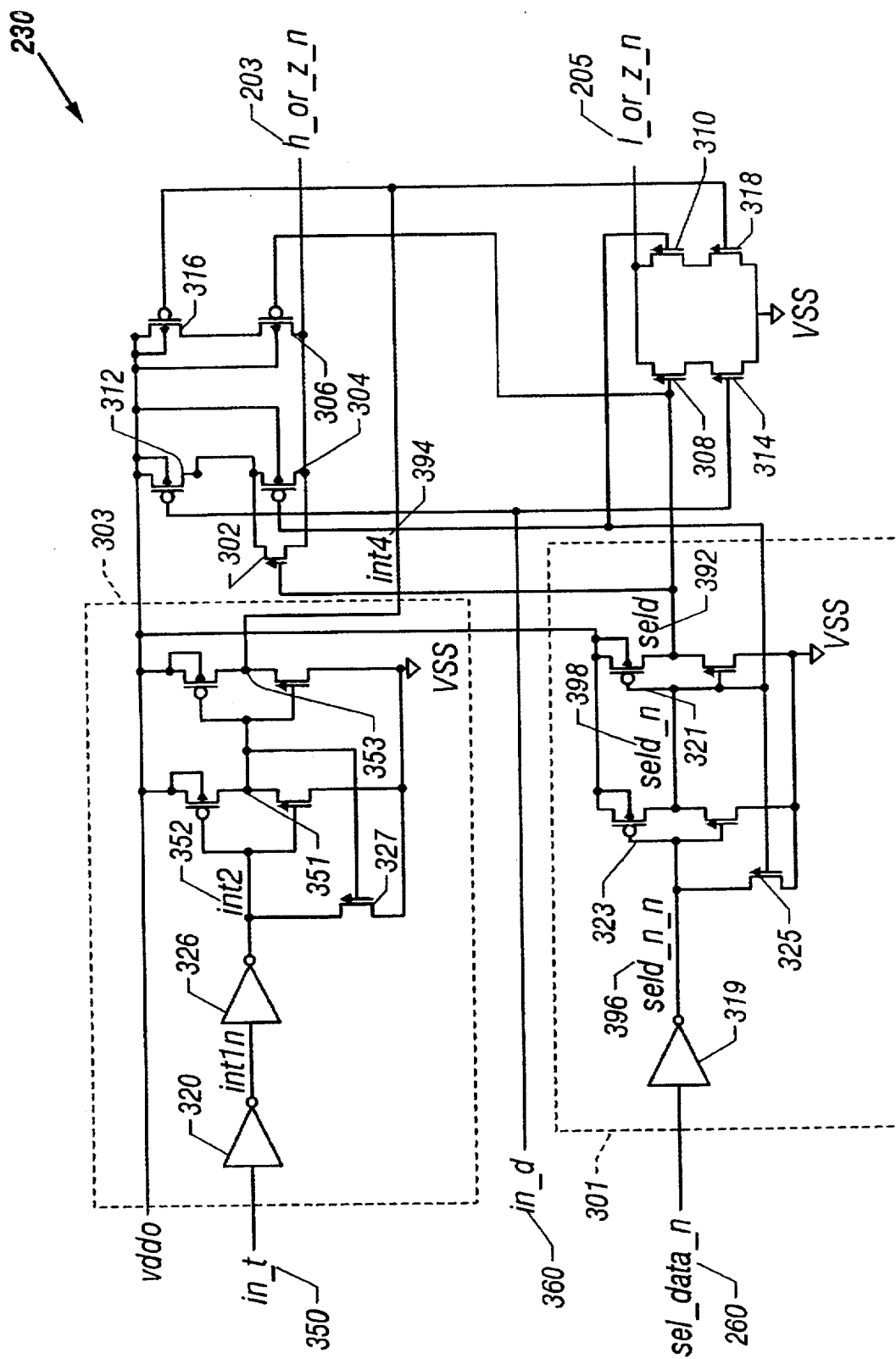
FIG. 3 shows a block diagram of the predriver of the pull up circuit for the driver circuit of FIG. 2.

Referring now to FIG. 3, multiplexor circuit 230 is shown in further detail. Multiplexor circuit 230 provides power protection circuitry including inverting circuits 301, and 303, as well as multiplexing transistors. Inverting circuit 303 includes inverting transistor pair 351 and inverting transistor pair 353. Inverting circuit 301 includes inverting transistor pair 323 and inverting transistor pair 321. The multiplexing transistors include NMOS transistor 302, PMOS transistors 312, 304, 306, and 316, and NMOS transistors 308, 310, 314, and 318.

Figure 4:
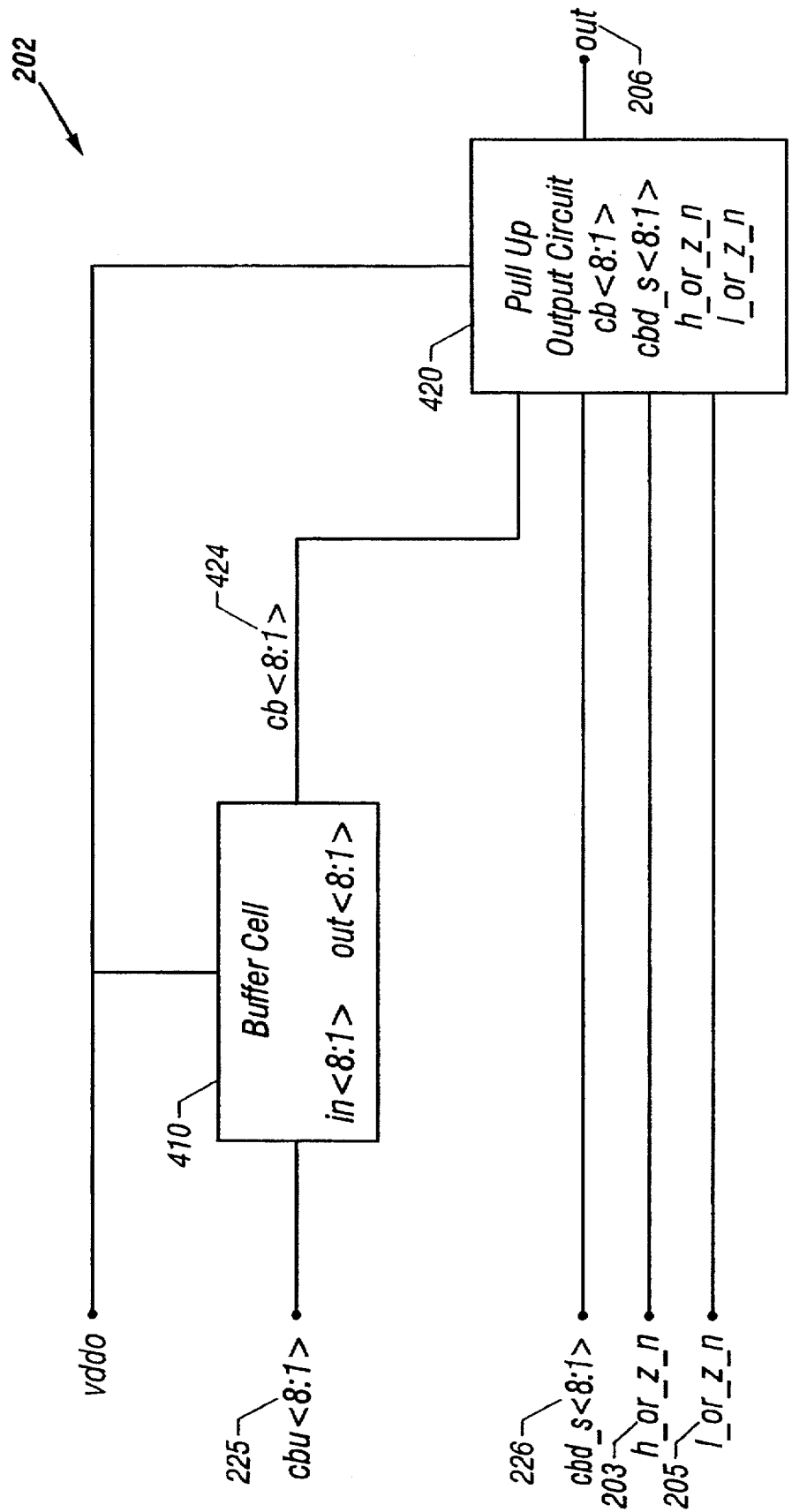
FIG. 4 shows a schematic block diagram of a parallel bit pull up circuit of the pull up circuit of FIG. 3.

Referring now to FIG. 4, the pull up circuit 202 is shown in block diagram form. Two inputs to the pull up circuit 202, i.e., high driving signal h_or_z_n 203 and low driving signal l_or_z_n 205 are received from multiplexor circuit 230, discussed above. As shown, pull up circuit 202 includes an impedance control buffer circuit 410 and a pull up output circuit 420.

Figure 5:
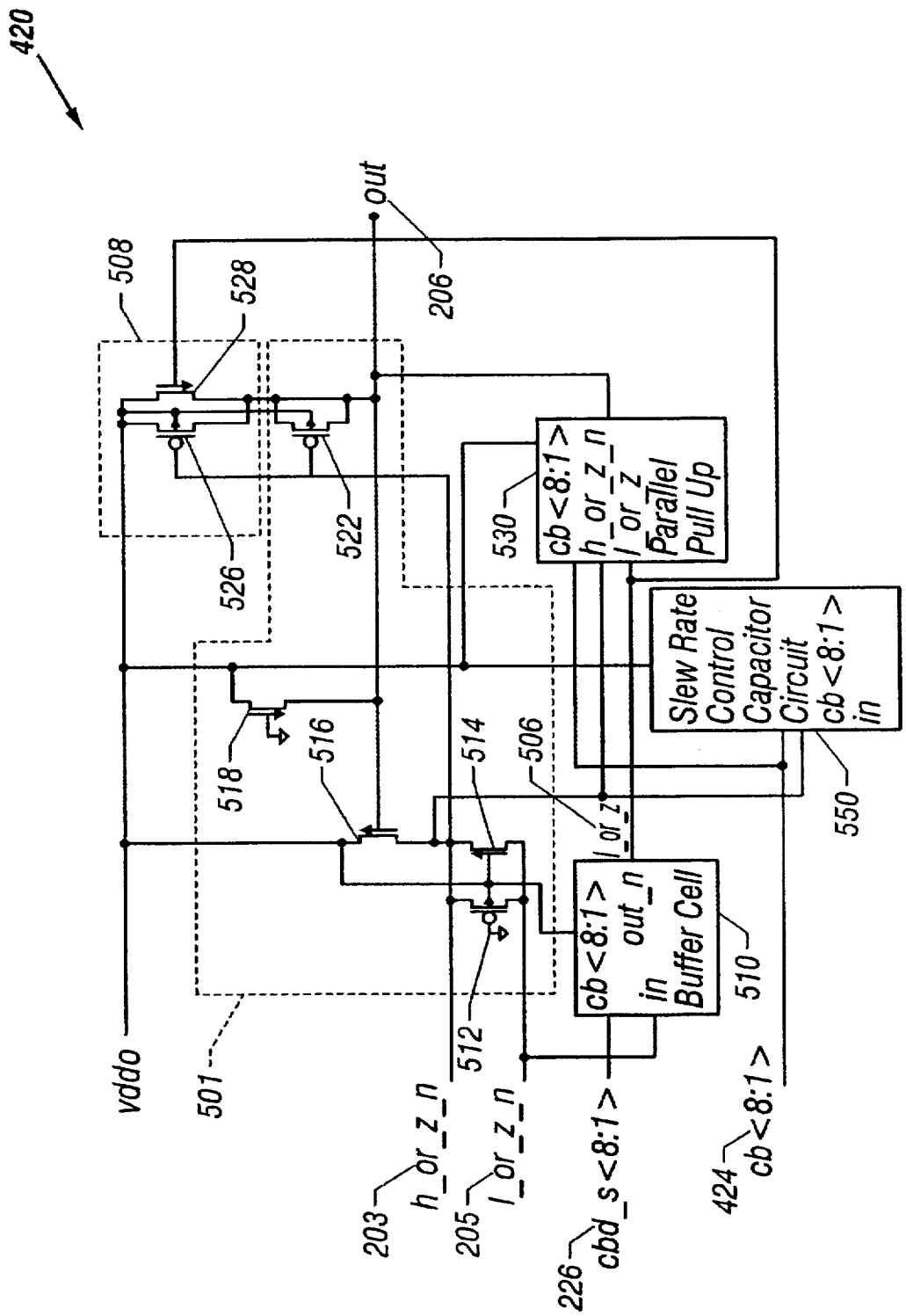
FIG. 5 shows a schematic block diagram of pull up output circuit shown in FIG. 4.

Referring to FIG. 5, a schematic of the pull up output circuit 420 is shown in further detail showing that the paths for h_or_z_n 203 and l_or_z_n 205 are received from multiplexor circuit 230, as well as signals cbd_s<8:1> 226 and cbu<8:1> 424. FIG. 5 shows inverting buffer cell 510, slew rate control capacitor circuit 550, parallel pull up circuit 530, and output control circuitry. The output control circuitry includes base bit pull up output element 508, which includes PMOS transistor 526 and NMOS transistor 528. Transistors 518, 516, 512, 514 and PMOS capacitor 522, togetherform pull up gate voltage control circuit 501.

Figure 6:
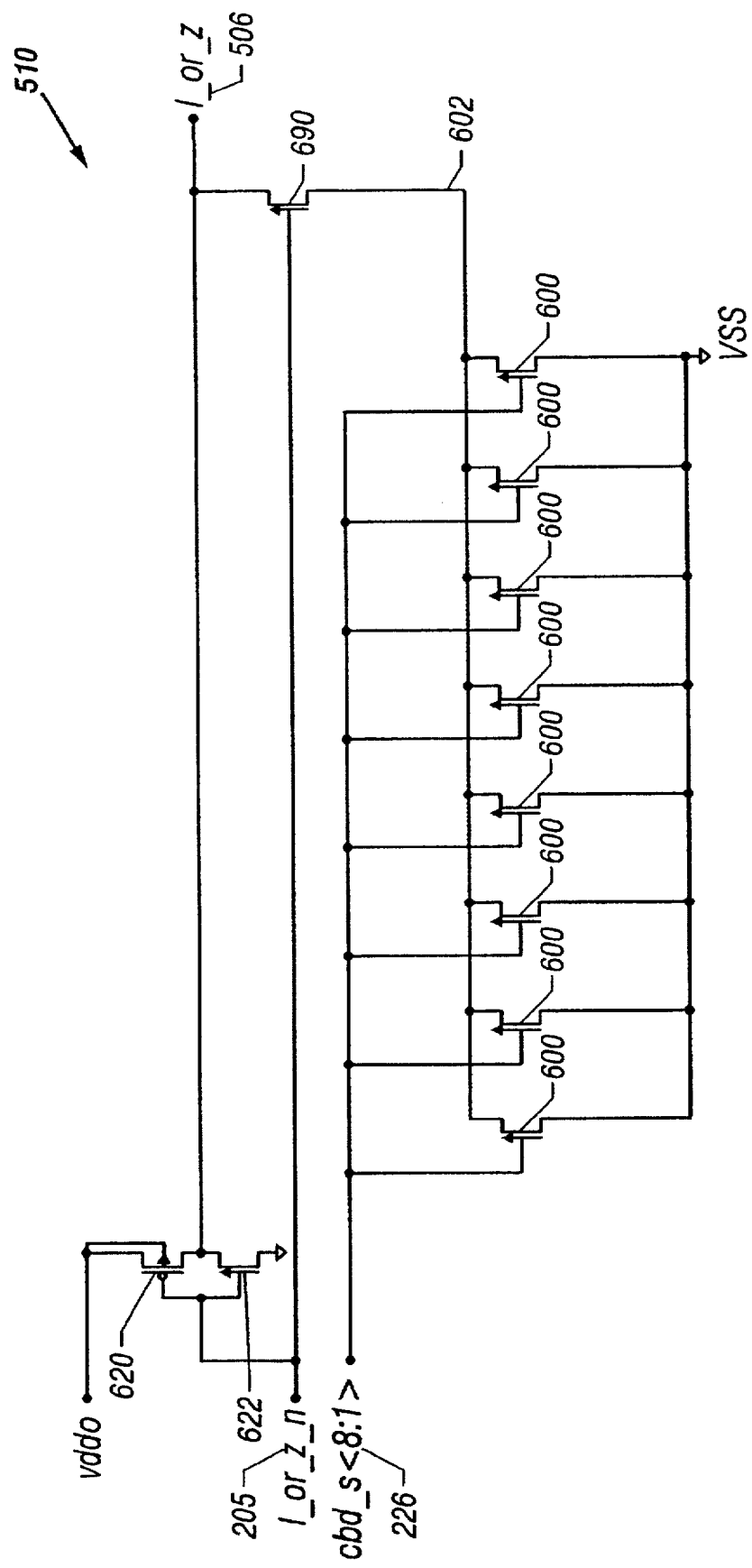
FIG. 6 shows a schematic of an inverter cell for the pull up output circuit shown in FIG. 5 for the driver circuit of FIG. 2.

Referring now to FIG. 6, inverting buffer cell 510 is shown in detail. FIG. 6 includes a parallel set of NMOS transistors 600, NMOS transistor 690, and an inverting transistor pair including PMOS transistor 620 and NMOS transistor 622.

Figure 7:
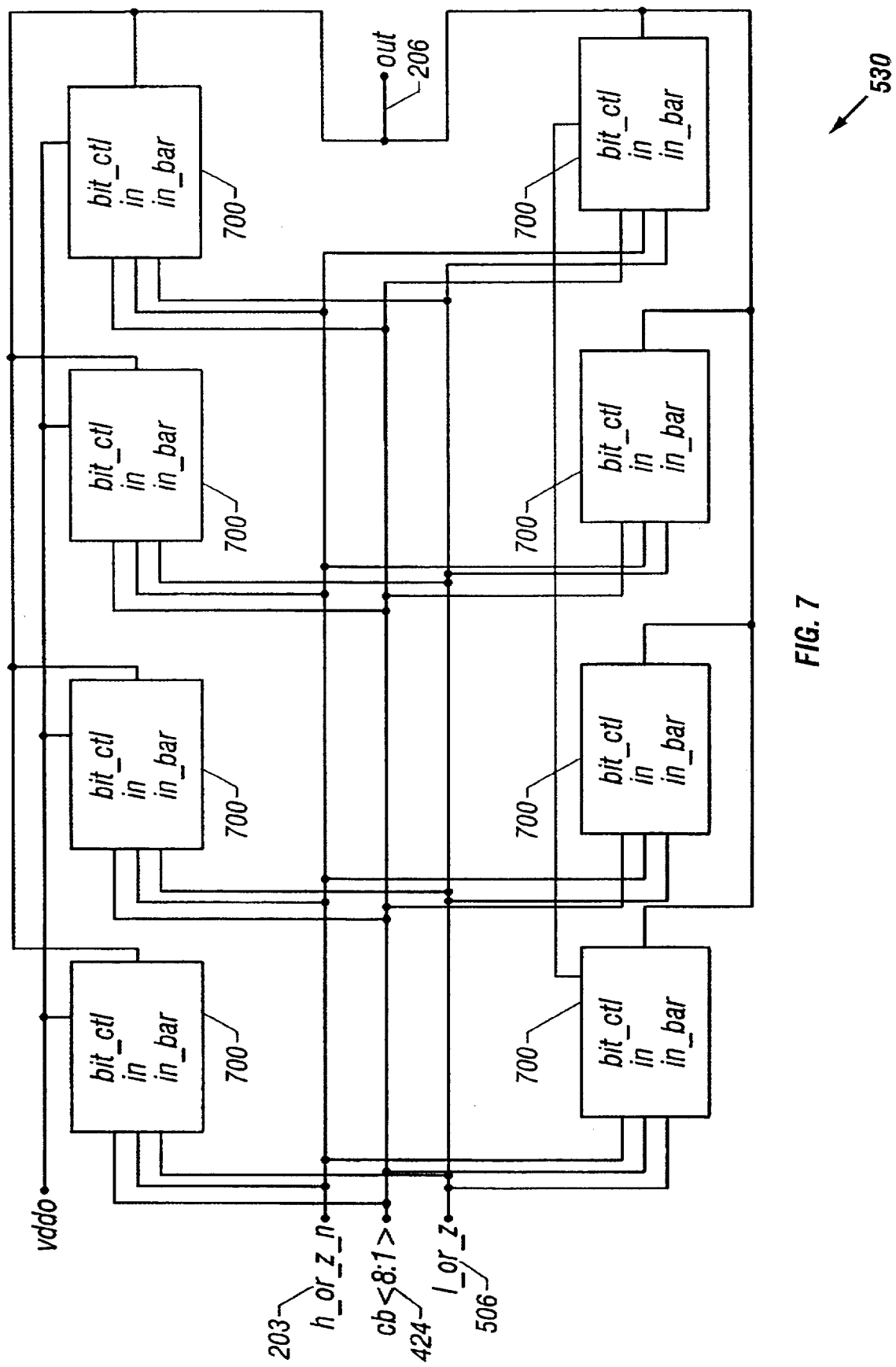
FIG. 7 shows a schematic block diagram of a parallel bit pull down circuit of the pull up circuit of FIG. 7.

FIG. 7 shows a block diagram of parallel pull up circuit 530 shown in FIG. 5. FIG. 7 shows the parallel configuration of individual supplemental pull up circuits 700. As shown, parallel pull up circuit 530 receives signals h_or_z_n 203 and l_or_z 506 and control signals cb<8:1> 424.

Figure 8:
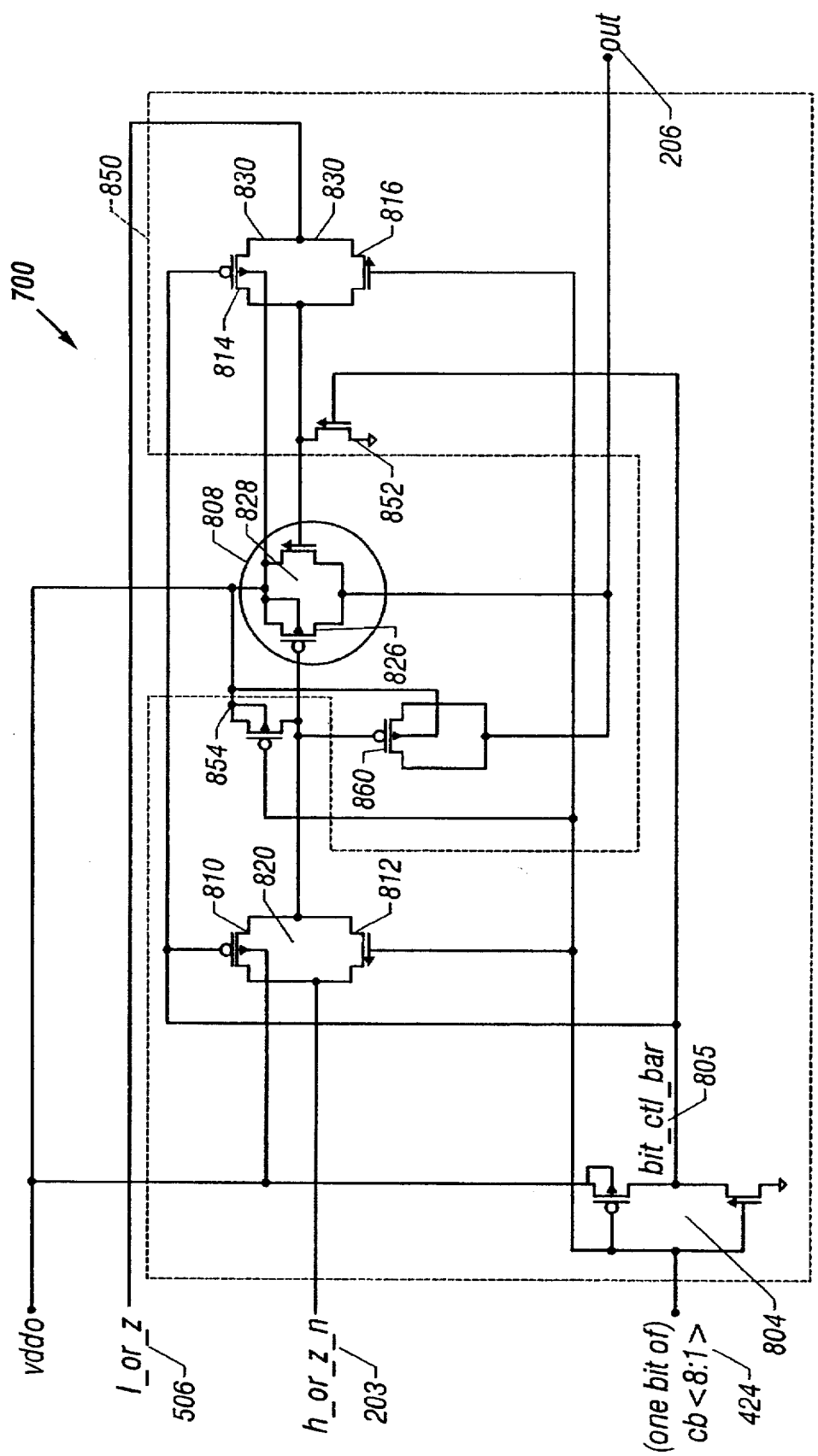
FIG. 8 shows block diagram of a parallel pull up circuit shown in FIG. 5.

FIG. 8 shows a schematic of a single supplemental pull up circuit 700, including supplemental pull up output element 808, a gate voltage control PMOS capacitor 860, and a bit control circuit 850. Supplemental pull up output element 808 includes PMOS transistor 826 and NMOS transistor 828. Bit control circuit 850 includes transmission gates 820 and 830 as well as PMOS 854, NMOS 852 and inverter 804.

Figure 9:
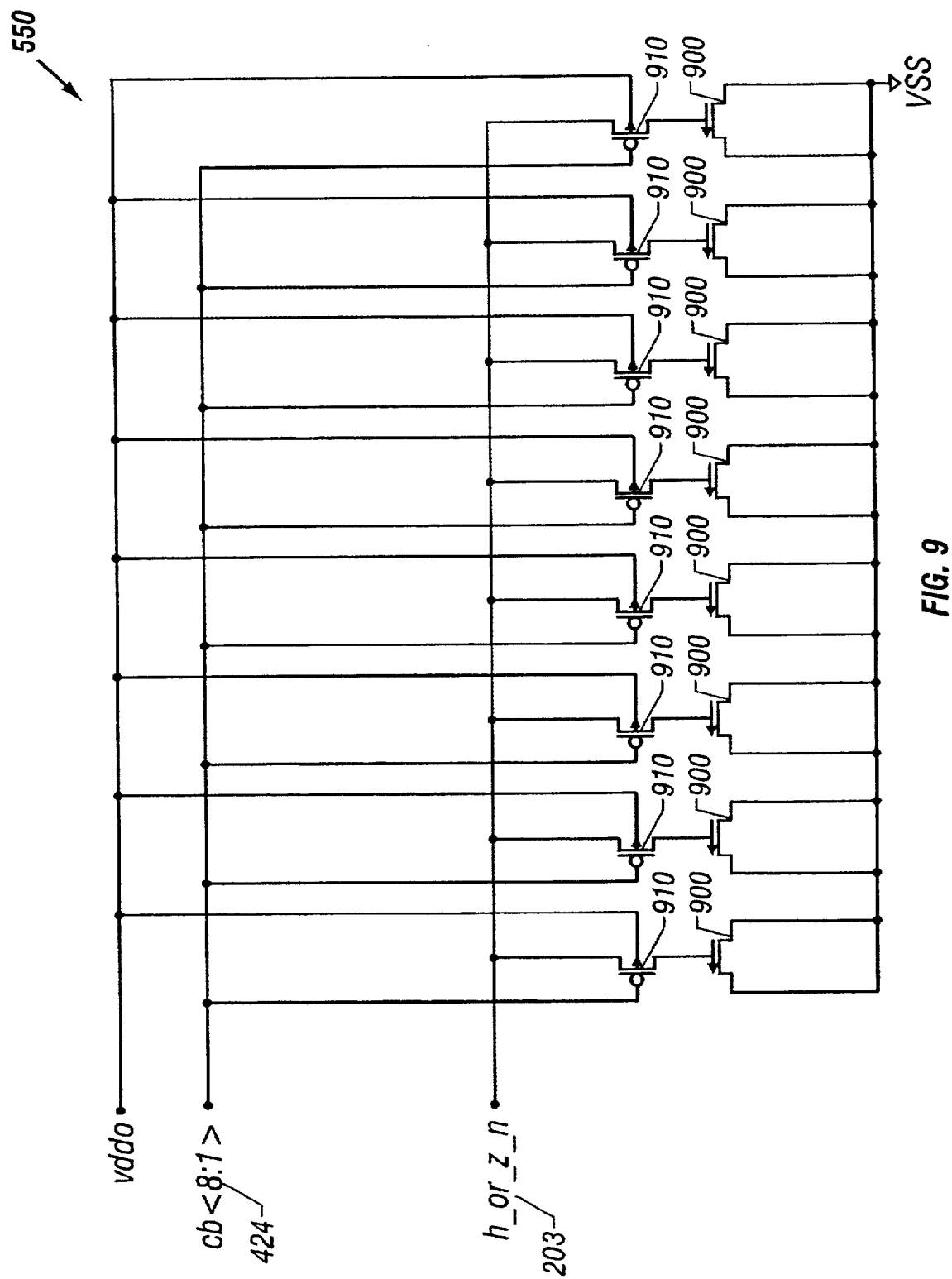
FIG. 9 shows a schematic of a slew rate control capacitor circuit shown in FIG. 5.

FIG. 9 is a schematic of slew rate control capacitor circuit 550. FIG. 9 includes a parallel set of NMOS capacitors 900 and a parallel set of PMOS transistors 910 coupled to the gates of capacitors 900.

Figure 10:
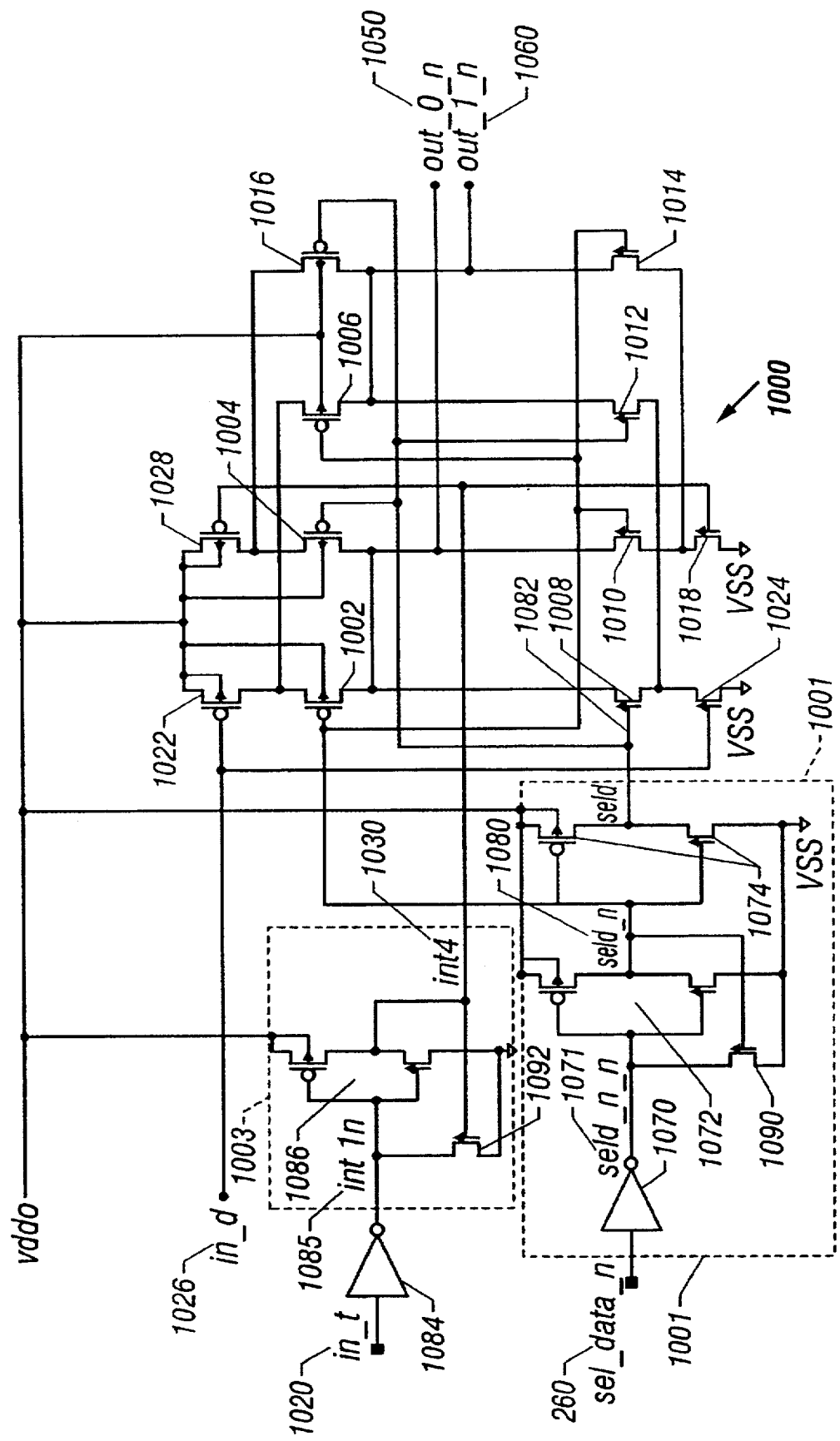
FIG. 10 shows a schematic of pull down multiplexor circuits shown in FIG. 2.

FIG. 10 relates to the pull down function of driver 110, showing a single schematic representing both multiplexors 240 and 250 shown in FIG. 2. FIG. 10 is similar to FIG. 3, and includes inverting circuits 1001 and 1003. Inverting circuit 1001 further includes inverting transistor pairs 1072 and 1074. Inverting circuit 1003 includes inverting transistor pair 1086 and NMOS transistor 1092. Also included in FIG. 10 are NMOS transistors 1008, 1010, 1012, 1014, 1024, and 1018, and PMOS transistors 1022, 1028, 1002, 1004, 1006, and 1016.

Figure 11:
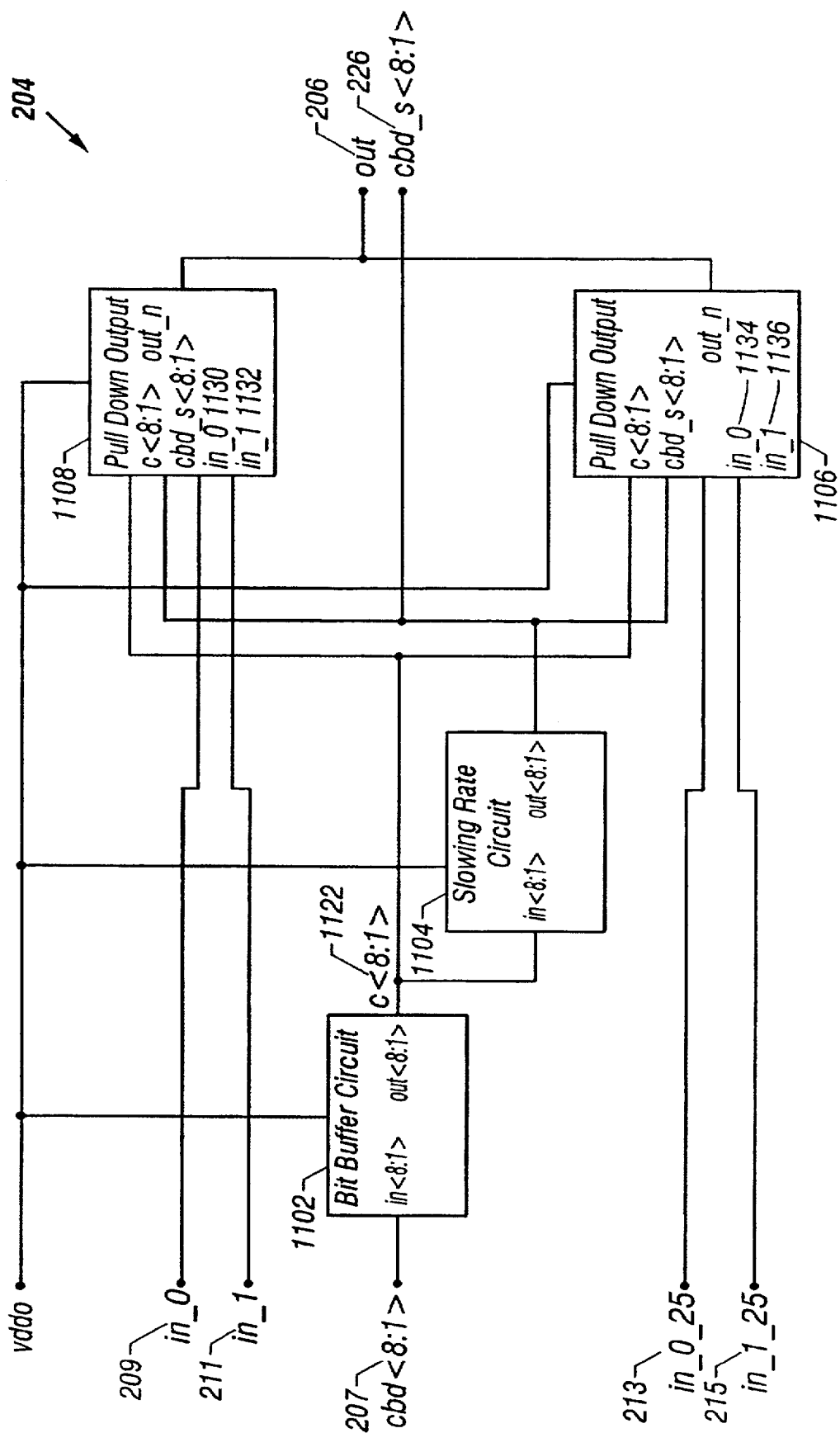
FIG. 11 shows a block diagram of a pull down circuit shown in FIG. 2.

FIG. 11 represents a block diagram of pull down circuit 204, showing the inputs in_0 209, in_1 211, in_0_25 213, in_1_25 215, received from multiplexor circuits 240 and 250. FIG. 11 includes pull down impedance control code bit buffer circuit 1102, slowing rate circuit 1104, and pull down output circuits 1108 and 1106.

Figure 12:
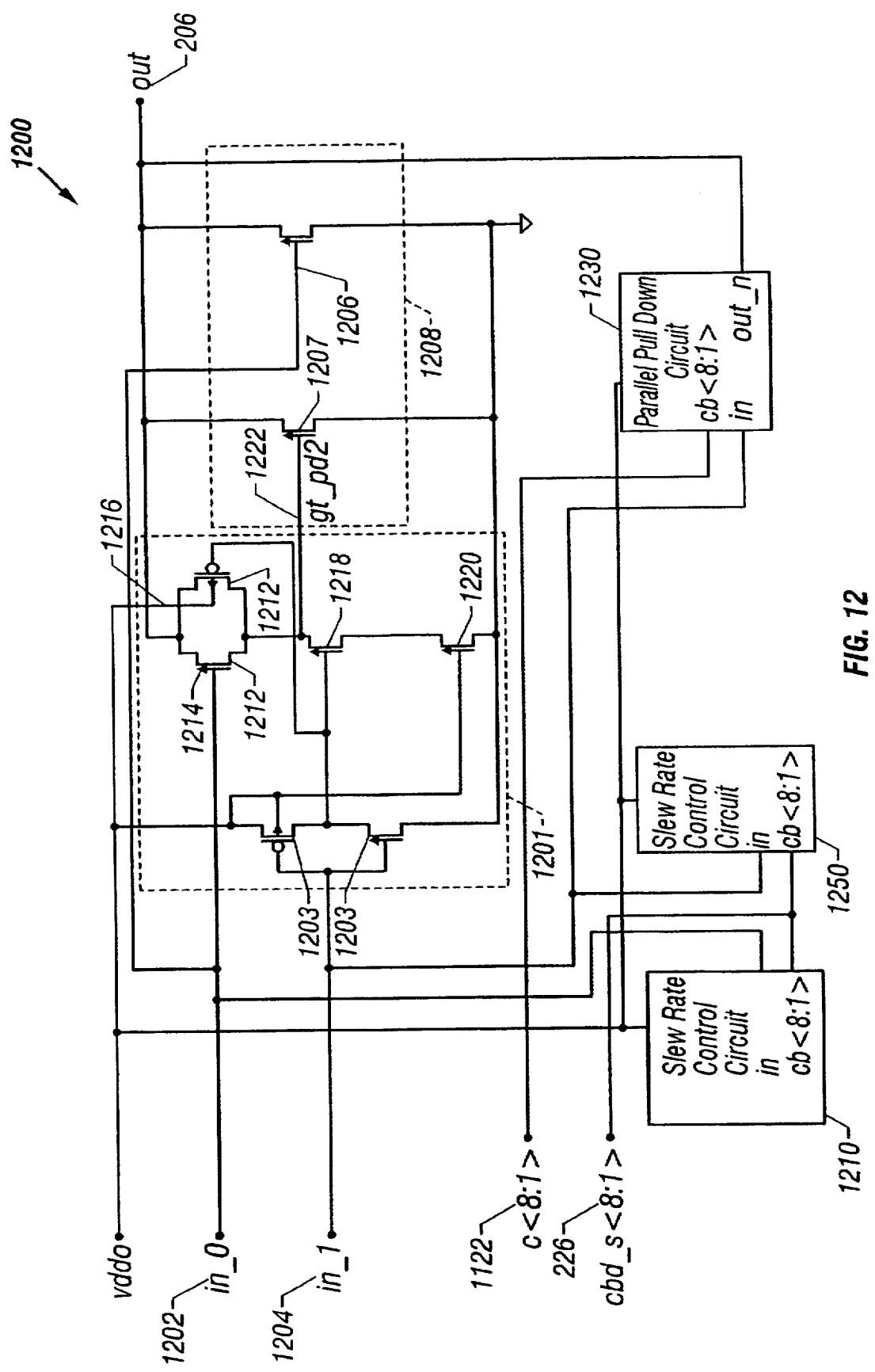
FIG. 12 shows a schematic of a generic pull down output circuit of pull down output blocks shown in FIG. 11.

FIG. 12 represents a single schematic representing both pull down output circuits 1108 and 1106. As shown, each pull down output circuit 1108 and 1106 includes parallel pull down circuit 1230, two slew rate control capacitor circuits, 1210 and 1250, pull down output element 1208, and a pull down driver control circuit 1201. Pull down driver control circuit 1201 includes inverting transistor pair 1203, transmission gate 1212, and NMOS transistors 1218 and 1220.

Figure 13:
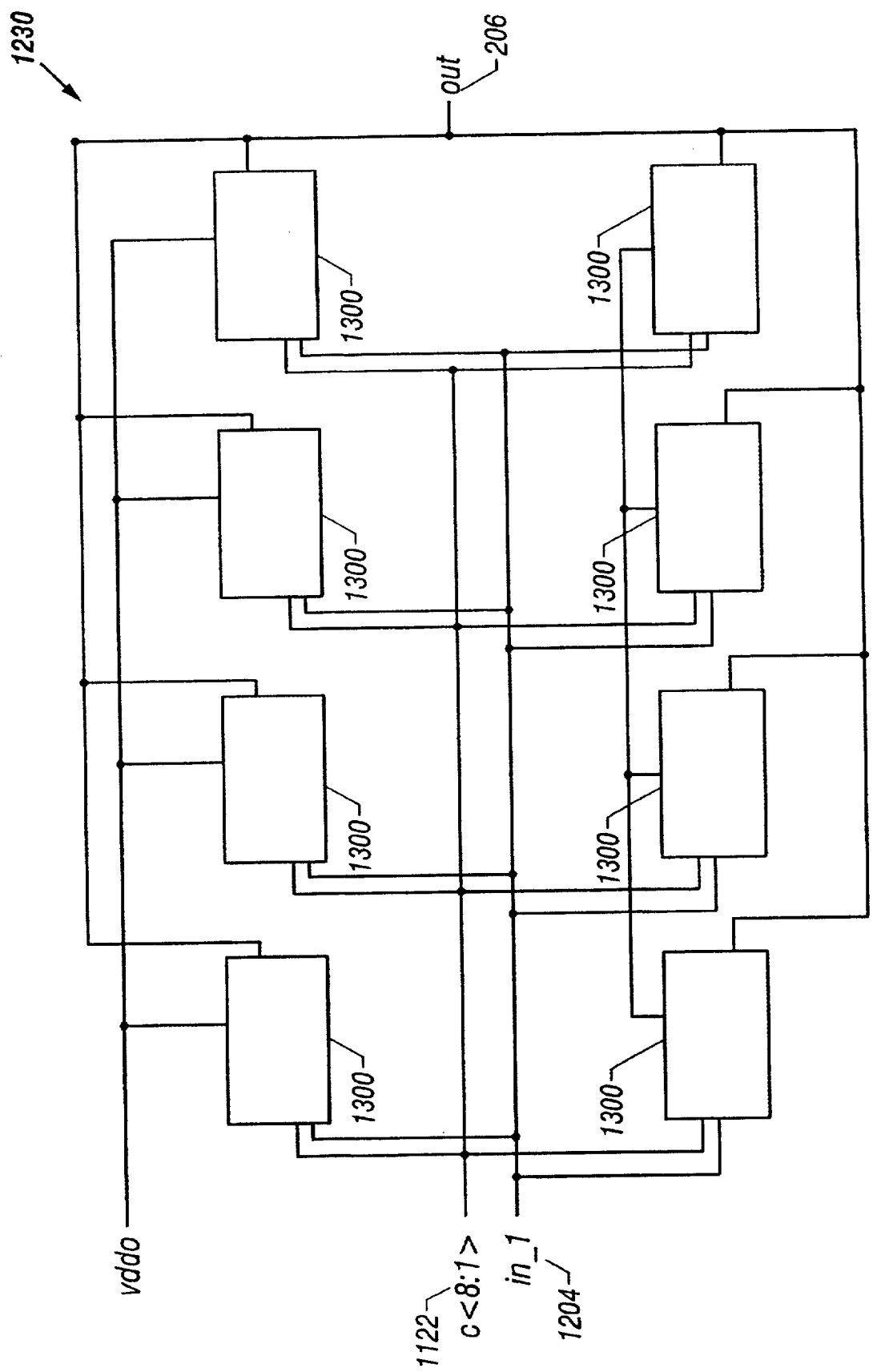
FIG. 13 shows a schematic block diagram of the parallel pull down circuit shown in FIG. 12.

FIG. 13 represents a block diagram of parallel pull down circuit 1230, showing the parallel set of supplemental pull down circuits 1300, and input signals c<8:1> 1122 and in_1 1204. FIG. 13 also shows the output OUT 206.

Figure 14:
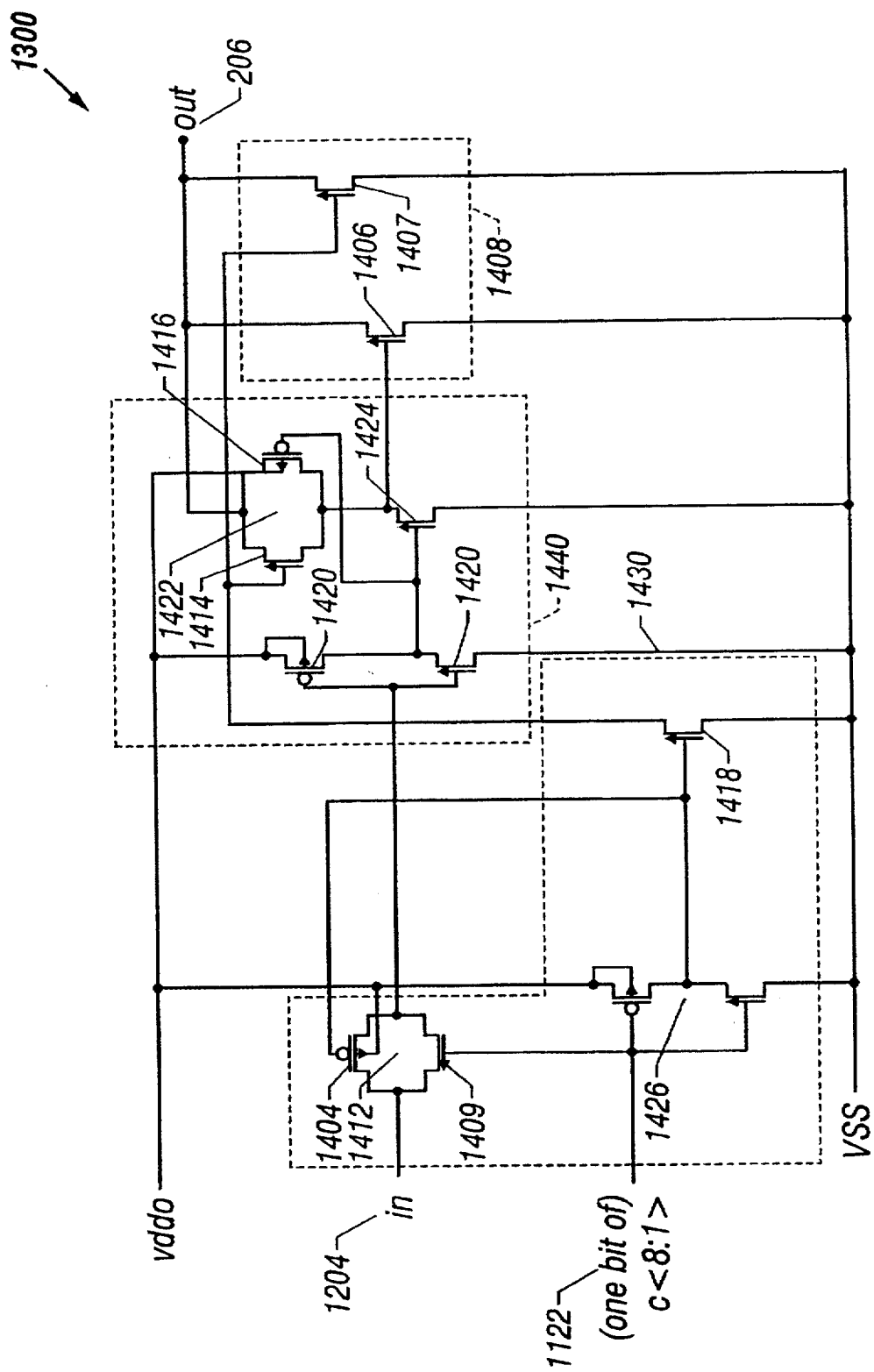
FIG. 14 shows a schematic of a generic supplemental pull down circuit of FIG. 13.

FIG. 14 is a schematic of a representative supplemental pull down circuit 1300 showing supplemental output element 1408, bit driver control circuit 1440, and bit control circuit 1430. Supplemental output element 1408 includes NMOS transistor 1406 and 1407. Bit driver control circuit 1440 includes transmission gate 1422, inverting transistor pair 1420, and NMOS transistor 1424. Bit control circuit 1430 includes transmission gate 1412, inverting transistor pair 1426, and NMOS transistor 1418.

Figure 15:
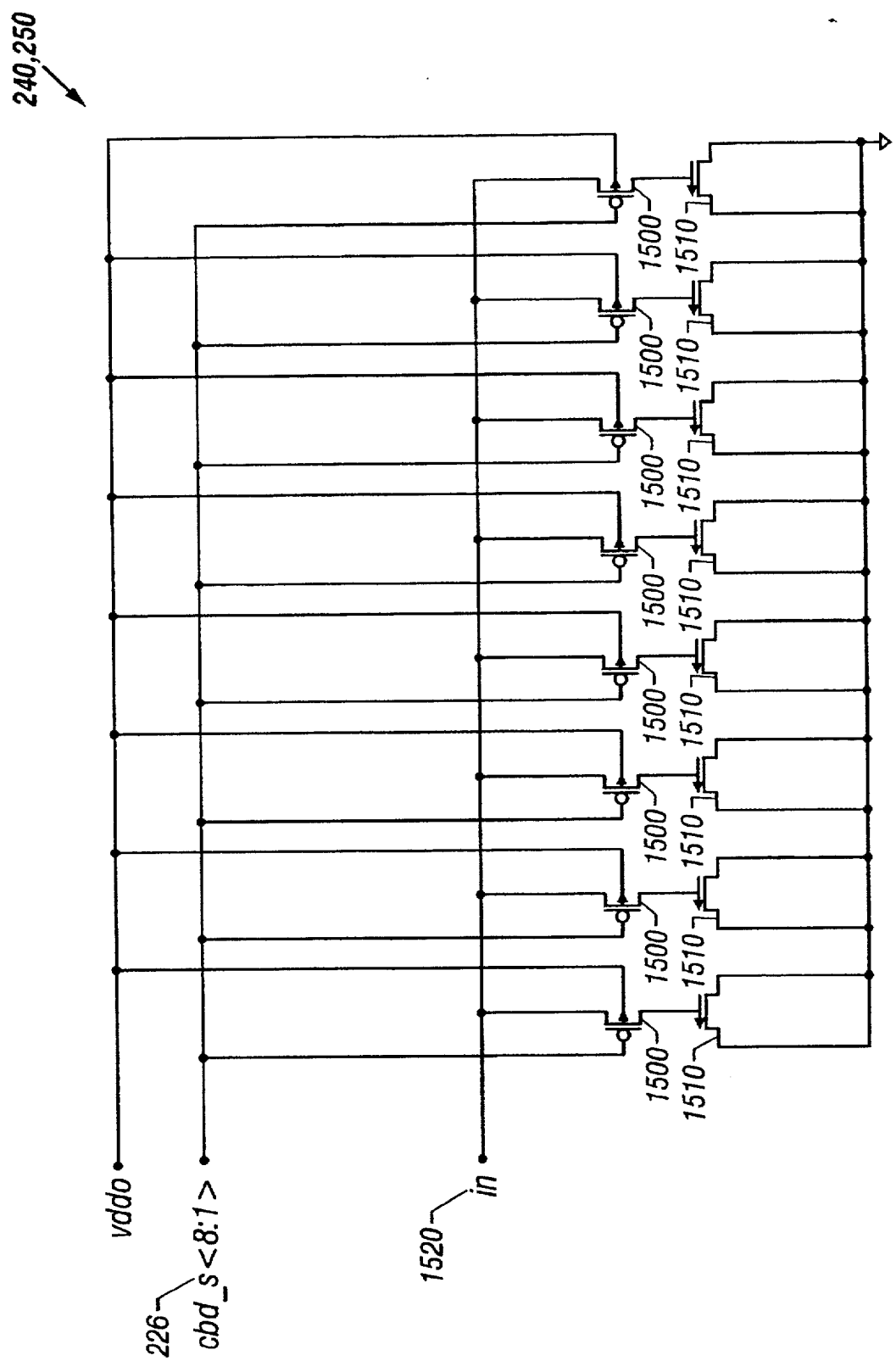
FIG. 15 shows a schematic of a slew rate control capacitor circuit shown in FIG. 12.

Referring to FIG. 15, slew rate control circuits 1210 and 1250 in FIG. 12 are represented as a single schematic representing both slew rate control circuits. As shown, both slew rate control circuits 1210 and 1250 receive signal set cb__s<8:1> 226. FIG. 15 includes a plurality of gate control PMOS transistors 1500 and a parallel set of NMOS capacitors 1510 coupled to the gate control PMOS transistors 1500.

Figure 16:
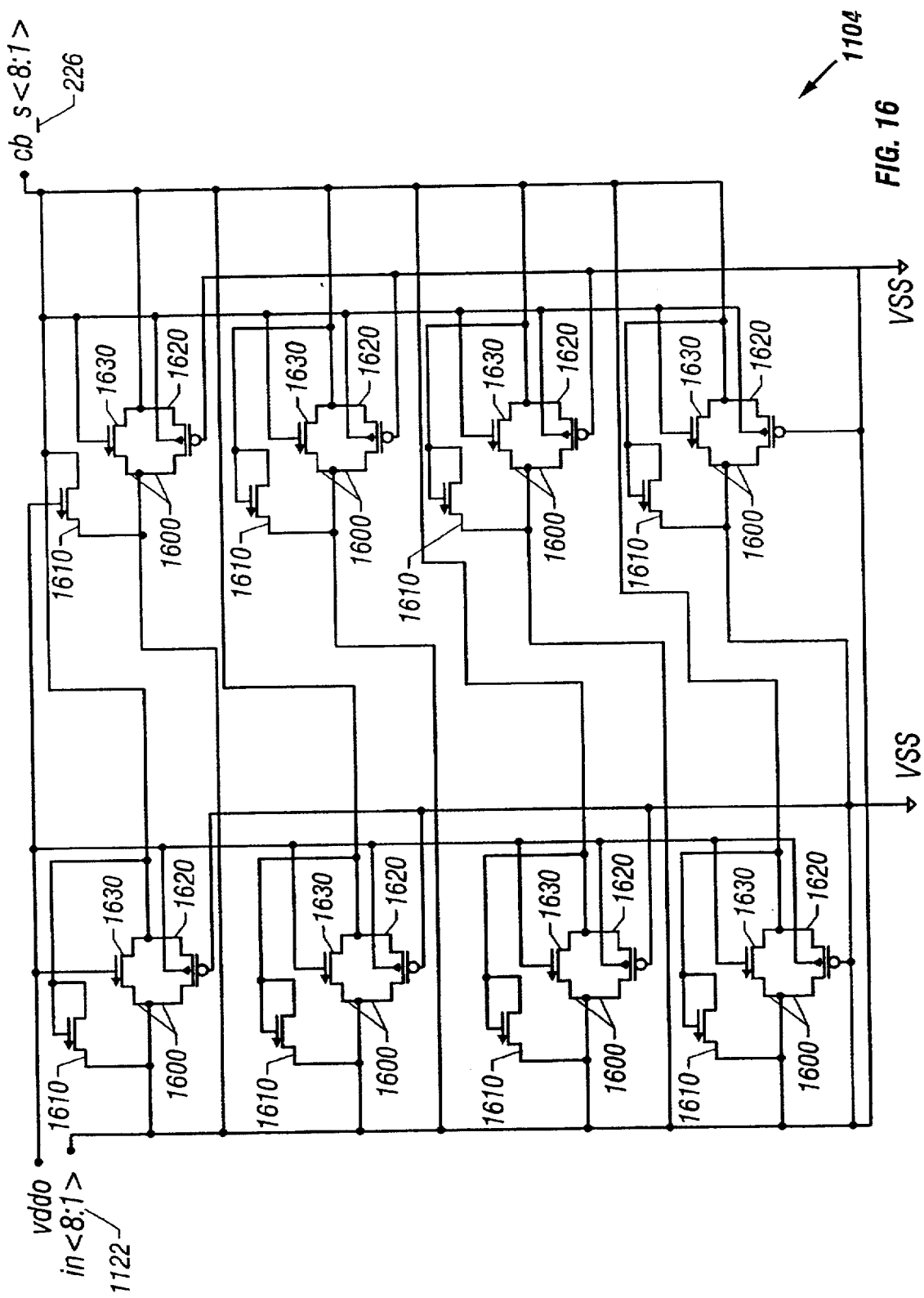
FIG. 16 shows a schematic of a slowing rate circuit shown in FIG. 11.

FIG. 16 is a schematic of the slowing rate circuit 1104 of FIG. 11, showing a plurality of NMOS transistors 1610 and transmission gates 1600, made up of NMOS transistors 1630 and PMOS transistors 1620.

Overview of Operation of Driver Circuitry

Referring now to FIG. 2, there are functional design differences between HSTL driver systems and DTL driver systems. Much of the functioning of the HSTL driver described in the above-referenced patent applications is symmetric between pulling high and pulling low. For example, the signal swing is from VSS to VDDO, and signals are launched by the turning on of the appropriate output circuit.

In contrast, the design of the DTL type driver system herein described includes asymmetry. For example, the signal swing is from VDDO/2 to VDDO, some signals are launched by the turning on of an output, and some signals are launched by the turning off of an output circuit. In addition, when the logic of driver is low, dc-current flows through the pull down circuit 204 of the driving-end and through the pull up circuit 202 of the receiving end(s). To accommodate these asymmetries between pull up and pull down functions, there are corresponding asymmetries in the design of the overall driver 110, as described below.

The FIG. 1 driver circuits 110 have an output stage that includes a pull up circuit 202 and a pull down circuit 204, shown in FIG. 2 and the outputs of these two circuits merge at the overall driver output node 206. The static logic-level inputs to two special control pins, up__open 208 and down__25 210, determine the output resistance of the driver 110 under different operating conditions.

In a "data-driving" mode, i.e. oe 220 is high and sel__data__n 260 is low, the driver output 206 logically responds in non-inverting fashion to the data 212 input. When data 212 is low, the pull up circuit 202 is disabled thereby causing a high impedance output; and the pull down circuit 204 is enabled thereby causing a controlled-resistance connection between the output node and the VSS rail. When data 212 is high, the opposite occurs with the pull up circuit 202 coupling the driver output 206 to the VDDO rail through a controlled resistance.

Although the output resistance of the pull up circuit 202, when enabled, is matched to the characteristic impedance of the transmission line (typically 50 Ohms), the output resistance of the pull down circuit 204, when enabled, is a function of the logic-input to control pin down__25 210. The output resistance of the pull down circuit 204, when enabled, is 50 Ohms if down__25 210 is low. The output resistance of the pull down circuit 204 is 25 Ohms if down__25 210 is high. A 25 Ohm pull-down resistance can also be accomplished by having two 50 Ohm pull down circuits 204 operate in parallel.

In a "data-receiving" mode, the pull down circuit 204 is disabled. However, if the logic-input to the up__open 208 control pin is low, the pull up circuit 202 is enabled and presents a 50 Ohm resistance between the output node 206 and the VDDO rail. If up__open 208 is high, the pull up circuit 202 is also disabled, and the driver 110 presents a high impedance to the output node 206.

Description of Operation

Referring now to FIG. 2, driver 110 includes various control and data inputs 220 that are logically-converted by control circuit 222, which may be represented by an alpha particle radiation-hardened clock-header/flip-flop cell. Control circuit 222 converts control inputs 220, 212, 208 and 210 into logical outputs di__up 214, di__dn 216, and di25__dn 224.

In one embodiment of the present invention, these three outputs go to inputs of multiplexors 230, 240, and 250. Referring now to FIG. 3, a detailed schematic represents multiplexor 230 in the pull up path, and referring to FIG. 10, a detailed schematic represents multiplexors 240 and 250 in the pull-down path. The logic-level of the sel__data__n 260 signal, which is the same signal for each multiplexor, determines which of the two inputs to each multiplexor 230, 240 and 250, is selected. The "data" input in__d 360, which is a different signal for each multiplexor 230, 240, and 250, is selected if sel__data__n 260 is low; and the "test" input in__t 350, is selected otherwise, to determine the given multiplexors' outputs.

For example, referring now to FIG. 2 and FIG. 3 in combination, if the selected controlling input (in__d 360 or in__t 350) to multiplexor 230 is low, the output h__or__z__n 203 is high and the output l__or__z__n 205 is high-impedance. Conversely, if the controlling input is high, the output h__or__z__n 203 is high-impedance and the output l__or__z__n 205 is low.

The outputs of multiplexor 230 go to the corresponding inputs of the pull up circuit 202. If input h__or__z__n 203 is high and input l__or__z__n 205 is high-impedance, the pull up output elements 508 and 808 will be disabled and will present a high-impedance to the output node OUT 206. If h__or__z__n 203 is high-impedance and l__or__z__n 205 is low, then pull up output elements 508 and 808 (if the corresponding impedance control is high) will be enabled and will couple the output node OUT 206 to VDDO through a controlled output resistance, as discussed in further detail below.

For each of the two multiplexors 240 and 250, if the selected controlling input is low, both of its outputs are high. If the controlling input is high, both of its outputs are low.

The two outputs of multiplexor 240, dt__0__n 209 and dt__1__n 211 shown in FIG. 2, provide the in__0 209 and in__1 211 inputs shown in FIG. 11 of the pull down circuit 204, and the two outputs of multiplexor 250, dt__0__25__n 213 and dt__1__25__n 215 shown in FIG. 2, provide the in__0__25 213 and in__1__25 215 inputs shown in FIG. 11 of pull down circuit 204. If all four of these signals are low, the pull down circuit 204 presents a high-impedance to the output node OUT 206. If the two outputs from one of the multiplexors 240 and 250 are high and the two from the other of the two multiplexors 240 and 250 are low, then pull down circuit 204 will couple the output node, OUT 206, to VSS through a resistance of 50 ohms. If all four signals are high, then the pull down circuit 204 will couple the output node, OUT 206, to VSS through a resistance of 25 ohms.

The mechanisms for controlling output resistance and output slew-rate across process, voltage and temperature (PVT) variations and across the range of output voltages in both the pull up circuit 202 and the pull down circuit 204 are described below. These mechanisms for the pull up circuit 202 depend on the eight-bit codes cbu<8:1> 225 and cbd__s<8:1> 226, which are transmitted to the pull up circuit 202. The mechanisms for the pull down circuit 204 depend on the eight-bit code cbd<8:1> 207 which is transmitted to the pull down circuit 204.

Pull Up Circuit Path

The elements within multiplexor 230 are shown in FIG. 3. Referring to FIG. 3, the primary control elements include NMOS transistor 302, PMOS transistor 304, PMOS transistor 306, NMOS transistor 308, and NMOS transistor 310. The gates of each of the transistors 302, 304, 306, 308 and 310 are controlled via nodes in the sel_data_n 260 path. When sel_data_n 260 is low, transistors 302, 304, and 308 are enabled and transistors 306 and 310 are disabled. As a result, when sel_data_n 260 is low, outputs h_or_z_n 203 and l_or_z_n 205 respond to 312 and 314, which are under the control of input in_d 360. If sel_data_n 260 is high, the pattern of enabling and disabling of the multiplexing elements is reversed. Thus, the outputs respond to PMOS transistor 316 and NMOS transistor 318 which are controlled by node int4 394. Node int4 394 is logically equivalent to input in_t 350 under normal operating conditions.

The type of multiplexing structure used here readily supports the requisite production of high-impedance outputs. Each output, when not high-impedance, need only be pulled towards one of the rails. Single-transistor pass-gates with the appropriate polarity can be used for the multiplexing circuits. Accordingly, complementary pair transistor transmission gates are not necessary. As described more fully below, NMOS transistor 302 is shown in parallel with PMOS transistor 304, producing an advantageous rate of pulling-up of h_or_z_n 203 that is advantageous for proper output slew-rate control of the overall driver 110.

Inverting multiplexor 230 includes fail-safe circuit 390. The fail-safe circuit 390 includes "fail-safe" circuitry that assures that if core-power fails while I/O power remains on h_or_z_n 203 will be high and l_or_z_n 205 will be high-impedance. As a result of the fail safe circuit 390, the pull up circuit 202 will present a high-impedance to the output node OUT 206. The inverter 319 is on core-power, so that its output, seld_n_n 396, will be low if core-power fails. The remaining inverters in the sel_data_n 260 path, i.e. inverter 321 and inverter 323, are on I/O power, so they will remain active if I/O power remains on. Consequently, in the event of a core-power failure with I/O power remaining on, node seld_n 398 will be high and node seld 392 will be low, and the outputs of the multiplexing structure will respond to the in_t 350 path rather than the in _d 360 path.

Inverters 320 and 326 on the in_t 350 path are on core-power so that node int2 352 and node int4 394 will be low if core-power fails and if I/O power from source VDDO remains on. The outputs of the multiplexors 230 respond to the in_t 350 path, i.e. node 394, if core-power fails and the I/O power remains on. Thus, h_or_z_n 203 will be high and l_or_z_n 205 will be high-impedance.

NMOS transistors 325 and 327 assure that nodes seld_n_n 396 and int2 352, respectively, go completely to VSS upon core-power failure when I/O power is still on. For example, if seld_n_n 396 had been high prior to core-power failure, inverter 319 would only pull signal seld_n_n 396 down to the threshold voltage, $V_{th}$, after the core-power failure since a PMOS transistor cannot pull a node any lower than $V_{th}$. NMOS transistor 325 thus pulls seld_n_n 396 down further to VSS.

Referring now to FIG. 4, pull up circuit 202, contains an 8-bit buffer cell, 410 and a pull-up output circuit 420. The buffer cell 410 has two purposes. First, the buffer cell 410 assures that the impedance-control bit-code signals are driven with the proper strength. Second, the buffer cell 410 does "level-shifting" of the bit-code signals from the core-power (VDD) domain to the I/O-power (VDDO) domain. As shown in FIG. 4 and FIG. 2 in combination, pull-up output unit 420 includes logic controlled by the outputs of multiplexor 230: the h_or_z_n 203 signal, which is connected to the h_or_z_n 203 pin of multiplexor 230, and the l_or_z_n 205 signal, which is connected to the l_or_z_n 205 pin of multiplexor 230. The output resistance and slew-rate of pull-up output circuit 420 are controlled across PVT variations by the eight-bit codes cbu<8:1> 225 and cbd_s<8:1> 226, as described in further detail below.

Referring now to FIG. 5, pull up output circuit 420 is shown in greater detail. As shown, pull up output circuit 420 includes inverter cell 510, which is an inverter whose pull-down resistance/strength is controlled across PVT variations by the eight-bit code cbd_s<8:1> 226. Inverter cell 510 accepts the l_or_z_n 205 signal as its input and inverts its logic-sense to produce output_l_or_z 506.

Referring now to FIG. 6 in combination with FIG. 5, inverter cell 510 is shown with greater detail. As shown, there are eight NMOS transistors 600, connected in parallel with their common drain 602 connected to the source of pull-down NMOS transistor 690. Functionally, the larger the number of transistors 600 that are enabled by having an enabling gate input, the smaller the resistance in series with NMOS transistor 690. As a result, when the l_or_z_n 205 input to inverter cell 510 is high the resistance through which node l_or_z 506 is pulled down is lowered as cbd_s<8:1> 226 has progressively more enabled bits.

Referring back to FIG. 5, when the input to node h_or_z_n 203 is high-impedance and the input to node l_or_z_n 205 is low, PMOS transistor 512 and NMOS transistor 514 pull down on node h_or_z_n 203 while NMOS transistor 516 pulls up on this node. Because transistor 512 is much larger than transistor 516, it will succeed in pulling h_or_z_n 203 down to a threshold voltage, $V_{th}$, above VSS, at which point transistor 512 will become disabled (since its gate-source voltage will no longer exceed $V_{th}$). As a result, the voltage on h_or_z_n 203 will be no higher than $V_{th}$. Instead, the voltage on h_or_z_n 203 will be between 0 (i.e. VSS) and $V_{th}$ as determined by the outcome of the "drive-fight" between transistors 516 and 514. The resulting voltage outcome is fairly independent of PVT variations because both transistors are NMOS transistors, and, therefore, respond similarly to PVT variations.

The gate of transistor 516 is connected to the output node OUT 260. Thus, the higher the output voltage, the greater the drive-strength of transistor 516, and the higher the resulting voltage on h_or_z_n 203. The purpose of this feature is to keep the output resistance of the pull up circuit 202 fairly constant across variations in the output voltage, as explained more fully below.

Still referring to FIG. 5, a PFET capacitor, 522, is connected between the output node OUT 206 and h_or_z_n 203 so that the voltage on h_or_z_n 203 will respond more quickly to changes in the output voltage than if such response were dependent on the action of transistor 516 alone.

When the input to h_or_z_n 203 is high and the input to l_or_z_n 205 is high-impedance, node l_or_z_n 205 is pulled high to VDDO, the voltage on h_or_z_n 203, by transistor 512. Additionally, transistor 514 pulls up on l_or_z_n 205 until its gate-source voltage drops below $V_{th}$, at which point it becomes cut-off. When l_or z_n 205 goes high, l_or_z 506 goes low.

The pull up "base-bit" output element 508 is an output element whose functioning is independent of the control bits cb <8:1> 424 of the pull up output unit 420. The base bit output element 508 is the parallel combination of PMOS transistor 526 and NMOS transistor 528. The gate of transistor 526 is connected directly to signal input h_or_z_n 203. Similarly, the gate of transistor 528 is connected to l_or_z 506. Thus, referring to FIG. 2 in combination with FIG. 5, if the input to h_or_z_n 203 from multiplexor 230 is high and the input to l_or_z_n 205 from multiplexor 230 to pull up circuit 202 is high-impedance, causing node h_or_z_n 203 (and l_or_z_n 205) to be high and node l_or_z 506 to be low, both transistors of the output element 508 will be disabled and will present a high-impedance to the output node OUT 206. If the input from multiplexor 230 h_or_z_n 203 is high-impedance and the input from multiplexor 230 to l_or_z_n 205 is low, then the node h_or_z_n 203 will be relatively low (the exact level being determined by the drive-fight) and the node l_or_z_n 205 will be low and node l_or_z 506 will be high. Consequently, both transistors of output element 508 will be enabled and will couple the output node, OUT 206, to VDDO through a controlled output resistance. The mechanisms of controlling the output resistance are described in the further detail below.

Referring now to FIG. 5 in combination with FIG. 7, pull up output unit 420, shown in detail in FIG. 5, shows parallel pull up circuit 530. Within parallel pull up circuit 530 there is a set of eight "supplemental pull-up bit" cells 700, shown in FIG. 7. Each of these cells 700 accepts the h_or_z_n 203 and l_or_z 506 signals shown in FIG. 5 inputs to parallel pull up circuit 530, and each accepts one corresponding signal from the set cb<8:1> 424 as an input.

Referring now to FIG. 8, within each of these cells 700 is a pull up output element 808 similar to element 508 shown in FIG. 5, consisting of the parallel combination of transistors, PMOS transistor 826 and NMOS transistor 828.

Still referring to FIG. 8, when a cell 700's cb<8:1> 424 input is high, bit_ctl_bar 805 is low. As a result, the two transmission gates in the bit control circuit 850 become enabled. The two transmission gates consist of transmission gate 820, which includes PMOS transistor 810 and NMOS transistor 812, and transmission gate 830, which includes PMOS transistor 814 and NMOS transistor 816. Enabling transmission gates 820 and 830 causes the two transistors of the output element 808 to be controlled by the h_or_z_n 203 and l_or_z 506 signals. In such case, PMOS transistor 854 and NMOS transistor 852 disable and do not affect the supplemental pull up circuit 700 functioning. PFET capacitor, 860, similar to PFET capacitor 522, is coupled between the output node OUT 206 and h_or_z_n 203 so that the voltage on h_or_z_n 203 will respond more quickly to changes in the output voltage.

Conversely, when a supplemental pull up circuit 700's cb<8:1> 424 input is low, node bit_ctl_bar 805 is high. As a result, transmission gates 820 and 830 are disabled, so that the two transistors of output element 808 are decoupled from the h_or_z_n 203 and l_or_z 506 signals. In such case, transistors 854 and 852 are enabled and serve to turn off the transistors 826 and 828 of output element 808. Thus, this supplemental pull up circuit 700 will present a high impedance to the output node OUT 206, regardless of the values of h_or_z_n 203 and l_or_z 506.

Referring back to FIG. 5 in combination with FIG. 9, pull up output circuit 420 also contains a set of NMOS capacitors within slew rate control capacitor circuit 550. Slew rate control capacitor circuit 550 is shown in detail in FIG. 9. As shown, eight NMOS capacitors 900 are shown, each of which is coupled to the h_or_z_n 203 node in the pull up output circuit 420 when the corresponding PFET pass-gate 910 is enabled. The pattern of enabling/disabling of pass-gate transistors 910 is controlled by the corresponding bits of code cbu<8:1> 207, which are connected to the gates of the transistors 910. The resulting pattern of coupling/decoupling of the NMOS capacitors 900 with respect to the h_or_z_n 203 node contributes to control of the output slew rate of the pull up circuit 202, as described more fully below.

Pull Down Circuit Path

Referring now to FIG. 2 in combination with FIG. 10, both pull down multiplexors 240 and 250 are represented by circuit 1000 as one generic circuit in FIG. 10. Although FIG. 10 represents a single circuit 1000 for both multiplexors, FIG. 2 shows that the difference in the multiplexors 240 and 250 is that multiplexor 240 receives a different in_t 1020 signal, i.e. ti_dn 228, than multiplexor 250, i.e. ti_dn25 232.

The primary multiplexing elements within pull down circuit 204 include transistors 1002, 1004, 1006, 1016, 1008, 1010, 1012, and 1014, whose gates are under the control of nodes in the sel_data_n 260 path. When sel_data_n 260 is low, transistors 1002, 1006, 1008, and 1012 are enabled and 1004, 1016, 1010, and 1014 are disabled, causing outputs out_0_n 1050 and out_1_n 1060 to respond to PFET transistor 1022 and NMOS transistor 1024, which are transistors under the control of input in_d 1026. If sel_data_n 260 is high, the pattern of enabling and disabling of the multiplexing elements 1002, 1004, 1006, 1016, 1008, 1010, 1012, and 1014 is reversed. Thus, the outputs respond to 1028 and 1018 which are controlled by node int4 1030, which is logically equivalent to input in_t 1020 under normal operating conditions.

The type of multiplexing structure used for multiplexors 240 and 250 advantageously provides output slew-rate control of the overall driver, as explained below. The difference in drive strengths between out_0_n 1050 and out_1_n 1060 can produce different slew rates, which can compensate somewhat for the differences in gate delay among driver elements in pull down circuit 204, i.e. in_0 and in_1 received from multiplexor 240, and in_0_25 and in_1_25 received from multiplexor 250.

The circuit 1000 includes "fail-safe" circuitry similar to circuit 230, discussed above relative to the pull up path. The fail safe circuitry assures that if core-power fails while I/O power remains on out_0_n 1050 and out_1_n 1060 will be low so that the output from the pull down output circuit 1108, and similarly 1106, discussed below, will present a high-impedance to the output node. Inverter 1070 is on core-power, so that its output will be low if core-power fails. The remaining inverters in the sel_data_n 260 path, i.e. transistor pair inverter 1072 and transistor pair inverter 1074, are on I/O power. As a result, inverters 1072 and 1074 remain active if I/O power remains on. Consequently, node seld_n 1080 will be high and node seld 1082 will be low, resulting in the outputs of the circuit 1000 responding to the in_t 1020 path rather than the in_d 1026 path.

Additional fail safe circuitry includes inverter 1084 and inverter 1086, both of which are coupled to in_t 1020. Inverter 1084 is on core-power so that node int1n 1085 will be low and node int4 1030 will be high, if core-power fails and I/O power remains on. Thus, under fail safe conditions, the outputs of the circuit 1000 respond to the in_t 1020 path, (i.e. int4 1030) and out_0_n 1050 and out_1_n 1060 present a low signal.

NMOS transistors 1090 and 1092 assure that nodes seld__ n__n 1071 and int1n 1085, respectively, reach VSS upon core-power failure when I/O power is still on. For example, if seld__n__n 1071 is high prior to core-power failure, inverter 1070 pulls signal seld__n__n 1071 down to $V_{th}$ after the core-power failure because a PMOS transistor cannot pull a node any lower than $V_{th}$. Next, transistor 1090 pulls seld__n__n down the rest of the way to VSS.

Referring now to FIG. 11, pull down circuit, 204, includes an 8-bit pull down buffer circuit 1102, two pull down output circuits, 1108 and 1106, and a slowing rate circuit 1104.

Pull down bit buffer circuit 1102 serves two purposes: a) to assure that the impedance control bit-code signals cbd<8:1> are driven with the proper strength, and b) to do "level-shifting" of the bit-code signals from the core-power (VDD) domain to the I/O-power (VDDO) domain. Bit buffer circuit 1102 receives cbd<8:1> 207 and outputs c<8:1> 1122.

Referring to FIG. 10 and FIG. 11 in combination, each pull down output circuit 1106 and 1108 includes logic controlled by the outputs generically shown as out__0__n 1050 and out__1__n 1060 of multiplexor circuit 1000, which go to inputs of the pull down output circuits 1106 and 1108, in__0 and in__1. As described below, each pull down output circuit 1106 and 1108 has an output resistance and slew rate that are controlled across PVT variations by the eight-bit codes c<8:1> 1122 and cbd__s<8:1> 226, which are connected to corresponding input pins of the same name. The slowing rate circuit 1104 accepts the buffered versions of the eight impedance-control bit-code signals, c<8:1> 1122, and outputs a logically-identical set of signals, cbd__s<8:1> 226, with rates of transition in the outputs that are slower than the rates for the inputs, particularly for high-to-low transitions. Accordingly, the slowing rate circuit 1104 reduces the amplitudes of transitory "spikes" in the driver output OUT 206, that can occur if such transitions occur too quickly.

Referring now to FIG. 12, the pull down output circuits 1106 and 1108 are represented by one circuit 1200. Pull down output circuits 1106 and 1108 are different only in the signals in__0 1202 and in__1 1204 input to the pull down output circuits 1106 and 1108. As shown in FIG. 11, pull down output circuit 1108 receives signals in__209 and in__1 211, and pull down output circuit 1106 receives signals in__0__25 213 and in__1__25 215. For purposes of simplification, signals 209, 211, 213, and 215 are represented in FIG. 12 as signal in__0 1202 and signal in__1 1204.

Referring back to FIG. 12, pull down base bit output element 1208 includes a parallel combination of two NMOS transistors, 1206 and 1207. Input in__0 1202 is coupled directly to the gate of 1206, thereby directly controlling whether transistor 1206 is enabled or disabled. Input in__0 1202 also controls whether or not NMOS 1214 of transmission gate 1212 is on or off. The logic-level of input in__1 1204 controls the enabling/disabling of PFET 1216 of transmission gate 1212. Additionally, the logic-level of input in__1 1204 controls whether NMOS transistor 1218 is on or off. NMOS transistor 1220 is in series with transistor 1218 and is always enabled, serving to limit the current through transistor 1218, thereby controlling the fall-rate of node gt__pd2 1222 when transistor 1218 is enabled.

Signals int__0 1202 and in__1 1204 always have the same logic-level and slightly different transition rates. As a result, if in__0 1202 and in__1 1204 are high: 1) transistor 1206 is turned on directly, 2) transistor 1218 is off, and 3) transmission gate 1212 is enabled, thereby coupling the gate of transistor 1207 to the output node OUT 206. Because the gate-source voltage of transistor 1207 is a function of the output-voltage OUT 206, transistor 1207 may be cut-off even if transmission gate 1212 is enabled.

Further, if in__0 1202 and in__1 1204 are low: 1) transistor 1206 is turned off directly and 2) transistor 1207 is turned off since transmission gate 1212 is disabled and transistor 1218 is enabled so that transistor 1218 pulls down the gate of transistor 1207. In summary, if in__0 1202 and in__1 1204 are high, pull down output element 1208 will couple the output node OUT 206 to the VSS rail through a finite resistance. Conversely, if in__0 1202 and in__1 1204 are low, pull down output element 1208 will present a highimpedance to the output node OUT 206. The in__1 1204 signal also goes to the input of parallel bit circuit 1230, shown in further detail in FIG. 13.

Referring now to FIG. 13, eight supplemental pull down circuits, 1300 connected in parallel are shown within parallel bit circuit 1230. Referring to FIG. 13 in combination with FIG. 14, one of the plurality of supplemental pull down circuits 1300 is shown in greater detail in FIG. 14. As shown in FIG. 14, each supplemental pull down circuit 1300 receives one of the impedance control bit signals cb<8:1> 1122. Further, each supplemental pull down circuit 1300 includes a supplemental pull down output element 1408 similar to the pull down output element 1208 located in the pull down output circuit 1200.

Functionally, when the corresponding impedance control bit input cb<8:1> 1122 input is high, transmission gate 1412, which includes NMOS transistor 1409 and PMOS transistor 1404 becomes enabled and NMOS transistor 1418 becomes disabled. In such case, the enabling and disabling of the pull down output element 1408 is controlled by the in 1204 input in the same manner as in the base bit pull down element 1208 shown in FIG. 12. When the bit of cb<8:1> 1122 is low, transmission gate 1412 becomes disabled, decoupling output element 1408 from the in 1204 input. NMOS transistor 1418 becomes enabled, causing output element 1408 to become disabled.

Accordingly, output element 1408 in each supplemental pull down circuit 1300 will be disabled when: 1) the appropriate bit of cb<8:1>1 1122 is low, or 2) the appropriate bit of cb<8:1> 1122 is high while in 1204 is low. Conversely, if the appropriate bit of cb<8:1> 1122 is high while in 1204 is high, output element 1408 becomes active. Those supplemental pull down circuits 1300 whose output elements 1408 are enabled present resistive coupling between the pull down circuit 204's output node and the VSS mil in parallel with the pull down base bit output element 1208. Those with disabled output elements 1408 present high-impedance outputs to the pull down circuit 204's output node.

Additionally, within the pull down output circuit 1200, the in__0 1202 node connects to the in input of slew rate control capacitor circuit 1210, and the in__1 1204 node connects to the in input of slew rate control capacitor circuit 1250.

Referring now to FIG. 15, both slew rate control capacitor circuits 1210 and 1250 are shown in further detail. As shown, both slew rate control capacitor circuits 1210 and 1250 contain a set of eight NMOS capacitors 1510. Each NMOS capacitor 1510 has a corresponding PFET transistor pass-gate 1500 connected between the gate of the respective NMOS capacitor 1510 and the capacitor circuit in 1520 node. The gates of each PFET transistor 1500 is coupled to a corresponding bit among cb__s<8:1> 226. When the input bit received by the PFET transistor 1500 gate is low, the respective PFET transistor 1500 is on and the gate of the corresponding NMOS capacitor 1510 is coupled to node in

1520. If the gate input to the PFET transistor 1500 gate is high, the PFET transistor 1500 is off and the NMOS capacitor 1510 is decoupled from node in 1520. The sets of capacitors shown in FIG. 15 contribute to control of the output slew-rate of the pull down circuit 204, further described below.

Referring now to FIG. 11 in combination with FIG. 16, slowing rate circuit 1104 is shown in further detail. As shown, slowing rate circuit receives in<8:1> 1122 from bit buffer circuit 1102 and outputs cb_s<8:1> 226. Functionally, slowing rate circuit 1104 limits the rate at which the cb_s<8:1> 226 signals can switch, particularly the high-to-low transitions. Limiting the rate of signal switching limits the amplitudes of "tugs" on the in_0 and in_1 nodes 1130, 1132, 1134, and 1136 in pull down output circuits 1108 and 1106. Such "tugs" are due to: 1) "charge-sharing" between the in_x nodes and the gates of the corresponding NMOS capacitors 1570 within 1210 or 1250 if the in_x nodes 1130, 1132, 1134, and 1136 are at different voltages than the capacitor-gates prior to their being coupled, and 2) Miller-capacitive coupling (via the gate-source capacitance of the PFET pass-gates) between the cb_s<8:1> 226 signals and the in_x nodes 1130, 1132, 1134, and 1136. The "charge-sharing" tug occurs on high-to-low transitions only, while Miller-capacitive tugs occur for both transitions. Such tugs can produce brief changes in the gate-voltages of output-element 1208 transistors 1207 and 1206, and of output element 1408 transistors 1407 and 1406 for enabled elements 1300, thereby producing brief changes in the output-resistance of the pull down circuit 204. The brief changes, in turn, can produce undesirable voltage-spike "glitches" in the output of the driver 110. Keeping the transition rate of the cb_s<8:1> 226 signals slow keeps the amplitudes of the tugs small, which advantageously limits the amplitudes of the output voltage-spike glitches.

Referring to FIG. 16, each path from an in <8:1> 1122 node to its corresponding cb_s<8:1> 226 node in the slowing rate circuit 1104 goes through a parallel combination of a diode-connected NMOS transistor 1610 and a transmission gate 1600. PFET transistor 1620 of each transmission gate 1600 is sized to have a small enough channel length and a large enough width so that low-to-high transitions are only slightly slowed at the output cb_s<8:1> 226 compared to the input 1122, but are slowed to limit output-glitches due to Miller-capacitive coupling to tolerable levels.

Because high-to-low transitions at the output cb_s<8:1> 226 produce both types of tugs, and the "charge-sharing" tug can be particularly large if the transition rate is too fast, the rate of the high-to-low transitions at the output cb_s<8:1> 226 must be significantly slower than the low-to-high transitions (which only produce Miller-capacitive tugs) to prevent intolerable output-glitch amplitudes. Therefore, each NMOS transistor 1630 in each transmission gate 1600 is very resistive, having a large channel length and a small channel width. Although each PFET transistor 1620 in each transmission gate 1600 contributes to the early part of the high-to-low transition, each PFET transistor 1620 becomes "cut-off" when the output voltage at node cb_s<8:1> 226 drops below $V_{th}$. As a result, the early part of the high to low transition is relatively fast, while the latter part is relatively slow. The speed of the early part of the transition produces little "charge-sharing" tug because the PFET transistors 1500, shown in FIG. 15 do not turn on until their gate-voltage (i.e. the output of slowing rate circuit 1104) falls at least $V_{th}$ below VDDO. The diode-connected NMOS transistors 1610 also contribute to the early part of the high-to-low transition to keep the transition from being impractically slow (a particular risk in slow p-process PVT corners), but it also cuts off when the output voltage at node cb_s<8:1> 226 drops below $V_{th}$. Once transistors 1610 and 1620 are cut off, the only highly resistive 1630 transistors contribute to the high to low transitions. Because transistors 1630 are so resistive, the latter part of the high to low transition is very slow. Therefore, the full turning on of PFET's 1500 is very slow. Consequently, the charge-sharing tug is spread widely over time, limiting the amplitude of any resulting output voltage glitches on the output of pull down circuit 204.

Output Impedance Matching and Linearization

Referring now to FIG. 4 and FIG. 11, two output impedances that characterize the pull up output circuit 420 and the pull down output circuits 1108 and 1106 include a "dc" impedance and an "ac" or "instantaneous" impedance. As one skilled in the art appreciates, the dc output impedance at a given output voltage is given by the drain-source voltage, $V_{DS}$, divided by the drain-source (output) current, $I_{DS}$. Graphically, this corresponds to the inverse of the slope of a line from the origin to the point on the unit's $I_{DS}$ vs. $V_{DS}$ curve corresponding to the given voltage. The ac output impedance at a given voltage is given primarily by the inverse of the instantaneous slope of the $I_{DS}$ vs. $V_{DS}$ curve of the unit at the given voltage, but it is also affected by the capacitances and other "parasitics" loading the output node OUT 206.

The value of the dc output impedance affects a) the value of the voltage at the driver end upon launching a signal, b) the value of the voltage at the bus-node during intermediate (but sustained) states before the bus eventually settles, and c) the final value of the voltage to which the bus settles. For two-node DTL type systems in particular, it is important that the voltage at the receiving end of a launched signal settle to the final value upon the arrival of the incident wave. Further, in a back-to-back low-to-low signal switch, both ends launch signals simultaneously. Proper signal settling requires that the pull up circuit 202 and the pull down circuit 204 dc-impedances equal the characteristic impedance of the transmission line (e.g. 50 ohms). Because the bus voltage will be VDDO/2 under such circumstances, the dc output impedance of each of the pull up driver output units must be designed to be about 50 ohms when the voltage at its output node is VDDO/2. More specifically, the dc-impedance of the pull up circuit 202 is designed to be slightly more than 50 ohms, and the dc-impedance of the pull down circuit 204 is designed to be slightly less than 50 ohms resulting in an output swing will always be at least VDDO/2.

The ac output impedance constitutes the impedance "seen" by a signal edge as it impinges on a driver-output node. If the ac output impedance is designed to match that of the transmission line, wave fronts arriving at the driver terminate cleanly. If not, there will be "reflections" of the signal edge that propagate back into the transmission line. Reflections may increase the time required for the voltage on the line to settle to a level recognizable as having a high or low digital sense, thereby lowering the attainable signaling frequency. Maintaining a constant ac impedance is facilitated by maintaining a constant instantaneous slope of the $I_{DS}$ vs. $V_{DS}$ curve for the output unit over the range of output voltages.

For drivers consisting of transistors, establishing and maintaining a desired output impedance is problematic. The impedance characteristics of a transistor vary with process, supply voltage, and temperature (PVT) and with changes in the voltages across the terminals of the transistor. Special circuit schemes are needed to compensate for these variations.

Controlling Impedance Across PVT Variations, Pull Up Circuit

Referring now to FIG. 4, FIG. 5, FIG. 6 and FIG. 8 the pull up output circuit 420 includes a parallel combination of nine pull-up elements. The nine pull up elements include the base bit pull up output element 508 which is always enabled to respond to the signals on inputs h_or_z_n 203 and l_or_z_n 205, and eight supplemental output elements 808 which are selectively enabled and disabled by the eight bit code cbu<8:1> 225 to compensate for dc-impedance variations due to PVT variations. Each pull up output element 508 and 808 consists of a PMOS transistor, 526 and 826, respectively, and an NMOS transistor, 528 and 828 respectively, connected in parallel. One end of the parallel combination is coupled to VDDO and the other to the output node of the driver OUT 206.

As described above, proper swing of the output voltage requires that the dc output impedance be kept near a certain value (i.e. 50 ohms) when the output voltage is near VDDO/2. In the fastest PVT corner, only the base bit is enabled. Therefore, the pull up output element 508 transistors in the base bit are sized so that the dc-impedance impedance of their parallel combination is close to 50 ohms in the fastest corner when the output voltage equals VDDO/2. In the supplemental pull up circuits 700, the supplemental output element circuits 808, with the equivalent two transistors 826 and 828, are sized so that the enabling of each bit in a predetermined sequence reduces the prevailing net impedance by a fixed percentage (approximately 7% for this embodiment only). By enabling and disabling the proper number of bits, the dc-impedance of pull-up circuit 202, when the output voltage equals approximately VDDO/2, can be set to be within a fixed percentage (approximately 7% for this embodiment only) of the desired level (e.g. 50 ohms) in all of the PVT corners.

Controlling Impedance Across Variations in Output Voltage. Pull Up Circuit

Referring back to FIG. 5 and FIG. 8 in combination with FIG. 2, as the output voltage at node OUT 206 varies, there are changes in the voltages across the terminals of each transistor in pull up circuit 202 that is coupled to the output node OUT 206. The transistors coupled to the output node OUT 206 include the transistors in output elements 508 and 808. The changes in voltages across the transistors changes the output (drain-source) current of each transistor in output elements 508 and 808. For each individual transistor in elements 508 and 808, the relationship between its drain-source current, $I_{DS}$ and its drain-source voltage, $V_{DS}$, (i.e. its output resistance) changes over the range of possible output voltages. However, the net output current of each the output element 508 and 808 is the sum of the drain-source currents of the transistors in the given output element, i.e., transistors 526 and 528 in output element 508, and transistors 826 and 828 in output element 808. Further, the net output resistance of each output element 508 and 808 is that of the parallel combination of the output resistances of the appropriate pair of transistors. Therefore, if the output currents and output resistances of the two output transistors in output elements 508 and 808 can be designed to change in a complementary manner as the output voltage varies, the net output resistance of the overall pull up circuit 202 can be kept fairly constant as the output voltage varies.

Referring now to FIG. 5 and FIG. 8, transistors 526 and 826 are "normally-connected" in the sense that there source nodes are coupled to the rail VDDO, and their drain nodes are connected to the output node, OUT 206, and their gate nodes are not coupled directly to the output node 206 when the transistors are active. Consequently, the $I_{DS}$ vs. $V_{DS}$ relationship for these transistors 526 and 826 generally moves along a characteristic curve. However, the gate-voltage of the transistors 526 and 826 is not fixed, but increases as the output voltage increases. This is because the gate voltage is generated by the outcome of the "drive-fight" between transistors 516, 514 and 512. The higher the output voltage at node OUT 206, the stronger the source follower transistor 516, and the higher the gate-voltage on transistor 526 and 826.

Figure 17:
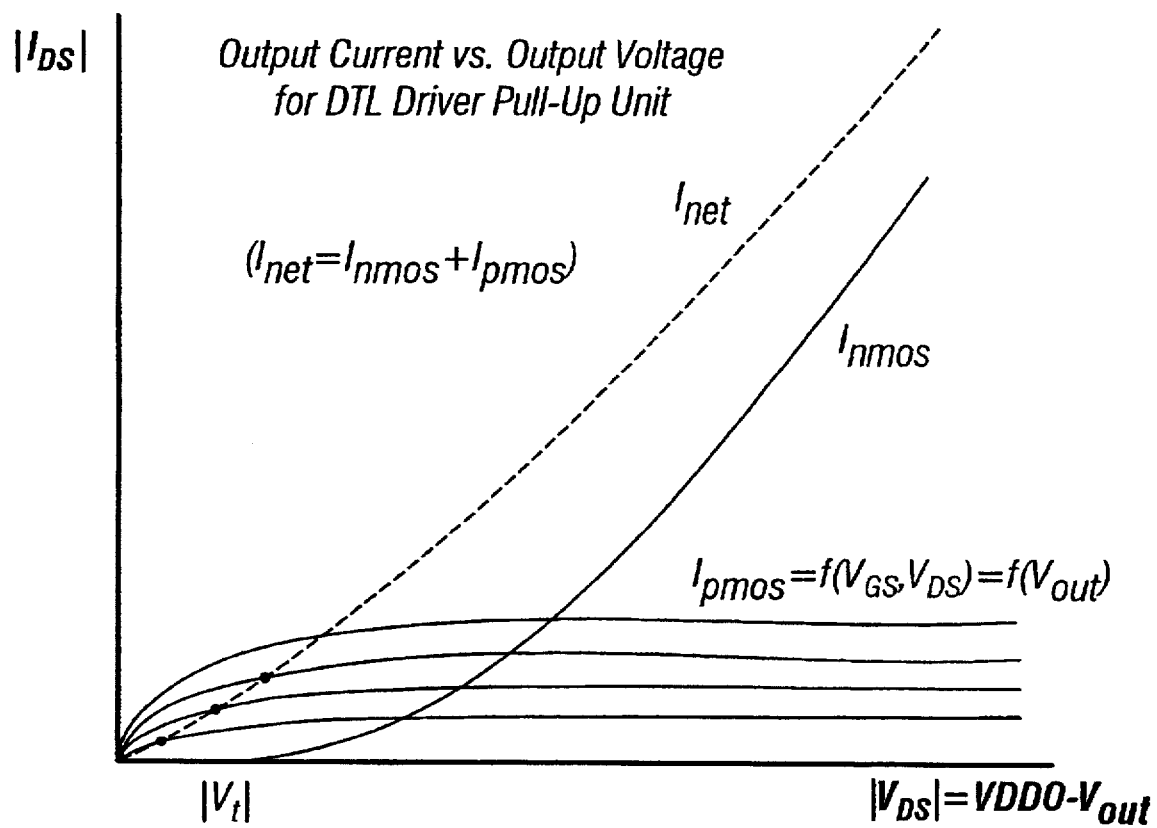
FIG. 17 shows a current-voltage curve for the pull up output circuit.

Therefore, at any given output voltage (i.e. VDDO–$V_{DS}$), the particular characteristic curve governing the $I_{DS}$ vs. $V_{DS}$ relationship for transistors 526 and 826 is also a function of the value of the output voltage. As the output voltage increases, the gate-voltage increases and, therefore, the gate-source voltage decreases, thereby selecting a characteristic curve with a lower $I_{DS}$ for a given $V_{DS}$. The net result is an $I_{DS}$ vs. $V_{DS}$ relationship that is more linear than it is for a normal characteristic curve as shown in FIG. 17. This is particularly so at lower $V_{DS}$ values (i.e. output voltage values between VDDO/2 and VDDO), which is the normal operating range for pull up circuit 202.

The NMOS transistors in each pull up output element, 528 and 828 are "diode-connected", meaning the gate nodes are at the same voltage as the drain nodes when active. Consequently, the drain-source voltage is identical to the gate-source voltage and, therefore, always greater than the difference between the gate-source voltage and the threshold voltage,($V_{DS}$>$V_{GS}$–$V_t$). Thus, each 528 and 828 transistor operates in its saturation region until the output voltage rises to within a threshold voltage of VDDO, at which point each 528 and 828 transistor is "cut off". The gate-source and drain-source voltages vary simultaneously, and the output current is a function of each. However, the effects of changing the gate-source voltage of each 528 and 828 transistor dominates, so that the shape of its $I_{DS}$ vs. $V_{out}$ curve is similar to that of its transconductance curve. This curve is nearly linear when the gate-source voltage exceeds the threshold voltage (e.g. when the output voltage is more than a threshold voltage below VDDO).

The net $I_{DS}$ vs. $V_{out}$ curve for the pull up circuit is the parallel combination of those for transistors 526 and 528 in output element 508, and transistors 826 and 828 in output element 808. Thus, with proper relative sizing of the transistors in pull up output elements 508 and 808, and the "drive-fight transistors" 516, 514 and 512, the net $I_{DS}$ vs. $V_{out}$ curve for the pull up circuit 202 can be kept fairly linear, constituting a constant ac impedance, over the range of possible output voltages. Of particular interest is the range of output voltages between VDDO/2 and VDDO, the normal operating range for the pull up circuit 202. In this range, the contribution from NMOS transistors 528 and 828 is very small relative to that of PMOS transistors 526 and 826. Therefore, the slope of the net $I_{DS}$ vs. $V_{out}$ curve is dominated by that for PMOS transistors 526 and 826, and the "drive-fight" mechanism described above has made this curve very linear in this range of output voltages as shown in FIG. 17.

Controlling Impedance Across PVT Variations. Pull Down Circuit

Referring now to FIGS. 11, 12 and 14, in combination with FIG. 2, impedance matching across PVT variations is accomplished in the pull down output circuit 1106 and 1108 in the same manner as in pull up circuit 202. For each pull down output circuit 1106 and 1108, there are nine pull-down output elements 1208 and 1408, pull down output element 1208 in the base bit circuit 1200, and supplemental pull down output element 1408 in the supplemental pull down circuits 1300. In each pull down output circuit 1106 and 1108, the pull down output elements 1208 and 1408 are connected in parallel between the output node OUT 206 and VSSO. The base bit pull down output element 1208 is always enabled, and the supplemental output elements 1408 are selectively enabled and disabled by the eight bit code cbd<8:1> 207 to give the desired dc impedance when the output voltage equals VDDO/2.

Controlling Impedance Across Variations in Output Voltage, Pull Down Circuit

Referring to FIG. 14 and FIG. 12 in combination, pull down output elements 1208 and 1408 provide linearization of the pull down impedance across variations in the output voltage. Each pull down output element 1208 and 1408 consists of two NMOS transistors, transistors 1206 and 1207 in pull down output element 1208, and transistors 1406 and 1407 in pull down output element 1408. Each of the transistor pairs are connected in parallel and have output currents and output impedances that change in complementary manners as the output voltage at node OUT 206 changes. Consequently, with proper channel sizing, the net dc and ac impedance of the parallel combination stays nearly constant near the desired value (e.g. 50 ohms) over most of the range of output voltages.

Although each bit of the pull up circuit 202 achieves impedance linearization by connecting a PFET transistor in parallel with an NMOS transistor, it would be impractical to use a P channel device in the output element of the pull down circuit 204 as the width of the P channel device would have to be very large. Accordingly, pull down circuit 204 connects two NMOS transistors in parallel for each bit output element of the pull down circuit 204. For example, in the base bit circuit 1200, NMOS transistors 1206 and 1207, together output element 1208, are connected in parallel. When the pull down output element 1208 is active, the transistor 1206 is connected in the "normal" manner for an NMOS pull down transistor, and 1207 is "diode-connected" via transmission gate 1212.

As a result, when pull down output element 1208 is active, transistor 1206 operates in the saturation region, and acts as a nearly-constant current source when the output voltage is less than a threshold voltage below VDDO. When the output voltage is below that, transistor 1206 operates in its "linear" region. When the output voltage is more than a threshold voltage above VSS, transistor 1207 operates in the saturation region; otherwise transistor 1207 is "cut off".

The output current of transistor 1206 follows its characteristic curve as the output voltage varies, and the output current of transistor 1207 generally follows the transconductance curve. Proper relative sizing of the two transistors 1206 and 1207 and proper relative timing of their activation can produce a fairly linear relationship, equivalent to the desired impedance, between the pull down circuit 204 net output current and the output voltage over most of the output swing. When transistor 1207 is cut off, this relationship is controlled entirely by the "linear" region of the characteristic curve of transistor 1206.

Both of the two transmission gate transistors, NMOS transistor 1214 and PMOS transistor 1216 in the base bit pull down output circuit 1200 and NMOS 1414 and 1416 in the supplemental pull down circuit 1300, in each pull down output circuit 1106 and 1108 are necessary since they have different roles relative to the timing of the activation of transistors 1207 and 1406, respectively. As the node in_0 1202 goes high, 1214 turns on, which pulls up the gate of 1207. This allows the activation of 1207 to be nearly simultaneous with that of transistor 1206. The activation of 1216 is delayed by an inverter, so that 1214 bears the full burden of activating 1207 early in the transition. Because NMOS transistor 1214 is cascode connected, the gate-source voltage falls as the output voltage increases causing its drive-strength to decrease. By the time these effects start to become significant, 1216 has become active and can pull the gate of 1207 the rest of the way up to the level of the output voltage.

Control of Slew Rate

Controlling the driver's output slew rate is needed for several purposes, including: a) to limit the amount of "bounce" in signal, power, and ground lines due to rapid current changes (large "di/dt") interacting with parasitics, b) to control the fraction of the cycle-period consumed by the signal's rise and fall times (as per system-specifications), and c) to control the amount "crowbar" current by controlling the lengths of the periods during which the pull up circuit 202 and the pull down circuit 204 of driver 110 are simultaneously active. Output slew rate is determined primarily by the output impedance of the driver 110 and the rates at which each output circuit is enabled and disabled. Strategies for controlling the output impedance have been described earlier. Additionally, controlling the slew rates of the voltages on the gates of the output transistor elements 508, 808, 1208 and 1408 control the rates of enabling and disabling of the pull up and pull down output circuits 420, 1106 and 1108.

To achieve the slew rate control goals, the primary step is to establish a desired overall slew rate for the output transistor gate nodes by establishing an appropriate "RC" constant for the voltage-transition of these nodes. More specifically, the product of the output resistance of the elements driving a given node and the capacitance loading that node is established to produce the desired overall slew rate. According to an embodiment of the present invention, the resulting RC product is maintained across PVT variations.

Figure 18:
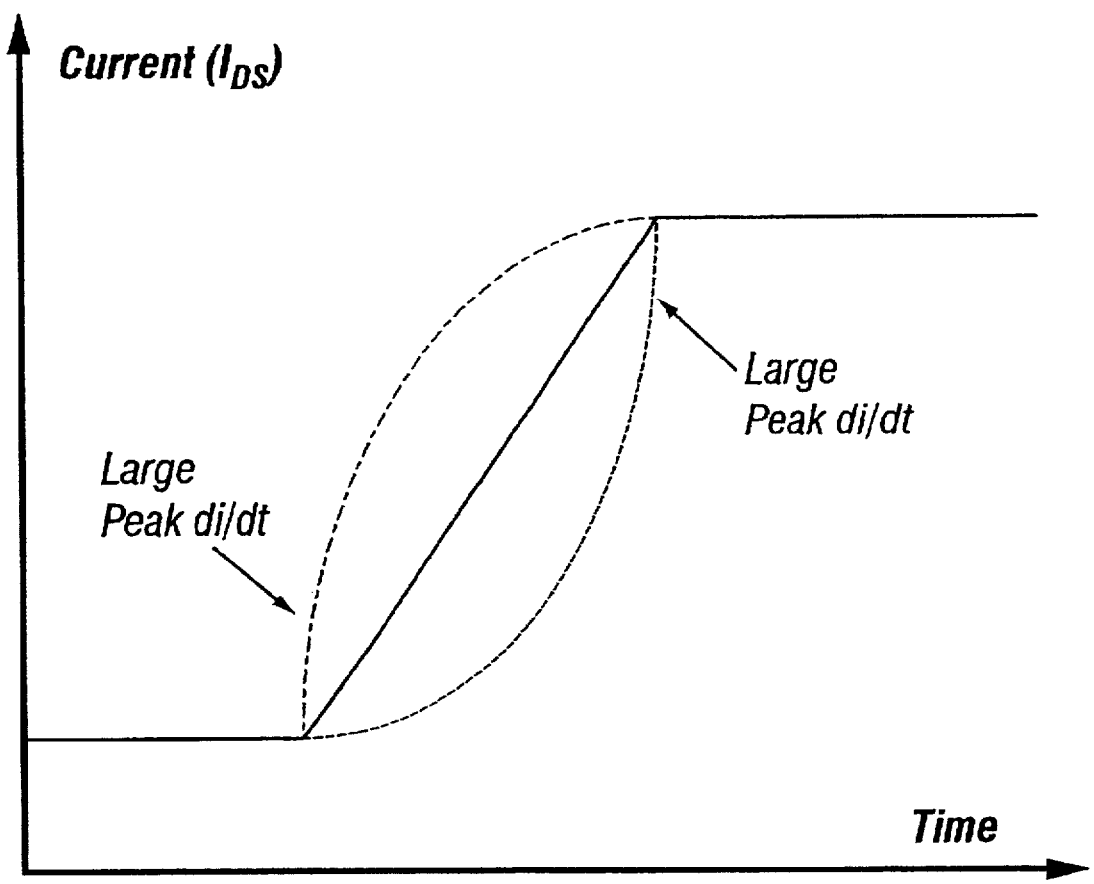
FIG. 18 is a current vs. time graph showing three ways in which the current ramps with time.

Additionally, the peak "di/dt" is controlled to limit "bounce" on the rails and signal lines in part by controlling the overall rate of transition of the gate-nodes, as described above. However, for any given overall transition period, the peak "di/dt" will be least if the ramping of the current is linear in time as shown in FIG. 18. Therefore, in accordance with an embodiment of the present invention, ramping of the current with respect to time is linear.

To maintain a fairly constant output resistance while driver 110 switches from pulling high to pulling low (or vice-versa), the enabling of the pull up output circuit 420 and the pull down output circuits 1106 and 1108 overlaps for some period of time. The crowbar current created by the enabling of circuits 420, 1106 and 1108 contributes to the linearization of the ramping of the currents described above.

Turning-Off of the Pull-Up Output Unit

Turning off the pull up output elements 508 and 808 launches a signal edge if on the previous cycle driver 110 acted as a pull-up terminator, and another driver in the system was pulling low. In such a case, current that was flowing from the VDDO-rail through the pull up output elements 508 and 808 becomes cut-off by the turning off of the pull up output circuit 420. Turning off the pull up output circuit 420 launches a low-going signal edge with a slew rate that must be controlled to meet timing specifications. Additionally, turning off the pull up output circuit 420 produces a current change with a rate (di/dt) that must be controlled to limit rail-bounce. If no other driver in the system pulled the current down on the previous cycle, then no current was flowing through the pull up output circuit 420. In such case, turning off the pull up output circuit 420 does not launch a signal edge or cause a change in current. Additionally, the turning off of the pull up circuit 202 is nearly always accompanied by the turning on of the driver's pull down circuit 204. Therefore, controlling crowbar current is also a consideration.

Controlling the slew rate of the signal edge at the output node of the pull up output circuit 420 and controlling the rate of current change is accomplished by controlling the slew rates of the voltages on the gates of the output element 508 transistors, transistors 526 and 528. For the turning off of output elements 508 and 808 of the pull up circuit 202, this means controlling the rise-rate of node h_or_z_n 203 and the fall-rate of node l_or_z 506. Additionally, for h_or_z_n 203 to rise completely, l_or_z_n 205 must also be pulled up via PFET transistor 512, mainly; the input to l_or_z_n 205 in such case is high-impedance.

These gate-node transition-rates are controlled mainly by controlling the "RC-constant" for these transitions, including compensation schemes to keep these RC-values fairly constant across variations in PVT conditions. As PVT variations cause the net output resistance of the elements pulling-up on node h_or_z_n 203 to change, compensating adjustments to the capacitance loading this node are made. As PVT variations change the output resistance of the individual elements pulling down on node l_or_z 506 (and the capacitive loading of this node by supplemental circuits also changes), the number of the elements operating in parallel to pull down node l_or_z 506 is adjusted to compensate.

Referring to FIGS. 2 and 3 in combination, in data-driving mode, the h_or_z_n 203 node is pulled up by the output path of the pull up multiplexor 230 consisting of PFET transistor 312 in series with the parallel combination of PFET transistor 304 and NMOS transistor 302. The pull up impedance-code cbu<8:1> 225 mainly tracks the changes in output resistance of PFET elements due to PVT variations. The PFET elements tracked include PFET transistors 526 and 826 because currents through pull up output elements 508 and 808 are dominated by those of the relevant PFET transistor. The pull up impedance-code cbu<8:1> 225 also largely tracks the effects of supply-voltage and temperature variations on NMOS transistors, including 828 and 528 but not process variations. Thus, the pull up impedance-code cbu<8:1> 225 accounts for most, but not all, of the resistance variations in NMOS transistor 302 due to PVT variations. As a result, code 225 can be used to selectively add or remove capacitive loading on node h_or_z_n 203 to compensate for decreases or increases, respectively, in the output-resistance of the elements that pull up node h_or_z_n 203.

Referring now to FIG. 5, compensation capacitors are contained in pull up capacitor circuit 550, shown in further detail in FIG. 9. Each NMOS capacitor 900 can be coupled to node h_or_z_n 203 by a corresponding pass-gate PMOS transistor 910, the gate of each being driven by a corresponding bit of the pull-up impedance control-code cb<8:1> 424. In "faster" PVT corners, in which the output-resistance of the elements pulling-up on h_or_z_n 203 is relatively small, more bits of cb <8:1> 424 will be low, enabling more of the pass-gate transistors 910 thereby increasing the capacitive loading on h_or_z_n 203. In "slower" PVT corners, the opposite occurs. As a result, as the "R" driving node h_or_z_n 203 decreases, the "C" loading node h_or_z_n 203 increases, keeping the "RC" constant for the rise-transition of node h_or_z_n 203 fairly constant across PVT variations.

The selective capacitive loading of node h_or_z_n 203 by the capacitors within capacitor circuit 550 must also compensate for the variations in capacitive loading on node h_or_z_n 203 due to the enabling and disabling of the supplemental pull up bit cells 700. For each enabled bit, wherein the corresponding bit of cb <8:1> 424 is high, the transmission gate 820 consisting of PMOS transistor 810 and NMOS transistor 812 is enabled so that node h_or_z_n 203 is loaded by the gate-capacitances of PFET capacitors 860 and 826. In each disabled supplemental bit cell 700 the transmission gate 820 is disabled, so the corresponding gate capacitance of transistor 860 and 826, is decoupled from node h_or_z_n 203. As a result, the capacitance within capacitor circuit 550 coupled to node h_or_z_n 203 due to a bit of cb <8:1> 424 being low must also compensate for the absence of this gate capacitance in the corresponding disabled supplemental bit cell 700.

Referring now to FIG. 5 in combination with FIG. 2 control across PVT variations of the rate of pulling-down of node l_or_z 506 is accomplished by utilizing the pull down impedance control code, cbd_s<8:1> 226. Code cb_s<8:1> 226 tracks variations in output resistance of NMOS transistors across PVT corners. Referring now to FIG. 5 and FIG. 6 in combination, in slower PVT corners, the code cb_s<8:1> 226 has more high bits, which enables more of the NMOS transistors 600 within inverting buffer circuit 510. Thus, as the output resistance of individual NMOS transistors 600 increases, the number of transistors in parallel pulling down on node l_or_z 506 is increased to compensate. As a result, as supplementary bit cells 700 are enabled and disabled there is control of the enabling of transistors 600 acting as pull down transistors that also compensates for the variations in capacitive loading of node l_or_z 506. Although the impedance control code cb<8:1> 424 is used for the enabling and disabling of the supplementary bit cells 700, the pull-down code cbd<8:1> 207 tracks code 424 to a significant degree because responses to voltage and temperature variations are fairly conmmon between the two codes. Further, the fraction of pull up output current flowing through NMOS transistor 528 is very small, on the order of five percent. Thus, tight control of the slew-rate of transistor 528 is not crucial to proper overall performance.

Turning-On of the Pull Up Circuit

In general, in DTL systems, the turning-on of a pull up circuit is sometimes a partial contributor, but never the main contributor, to a signal swing. If the turning-on of the pull-up of a driver is coincident with the turning-off of the pull-down of the same driver, it is the latter event which dominates the generation of the form of the signal edge. Therefore, the turning-on of pull up circuit 202 primarily serves to limit the size of the resultant overshoot of the voltage at the output node to a level that avoids degrading the physical integrity of the output transistors 508 and 808. For example, the turning on of pull up circuit 202 limits the overshoot of the voltage at the output node to 1.25*VDDO, as opposed to 1.50*VDDO if pull up circuit 202 does not turn on.

The requirements for the slew-rate of the turning-on of the pull up circuit 202 are relatively limited. The requirements for the slew rate include a) the slew rate must be appropriate for allowing the proper amount of crowbar current due to overlap with the turning-off of pull down circuit 204, and b) the slew rate must be fast enough in every PVT corner to prevent excessive overshoot of the voltage at the output node.

Referring to FIG. 5, the turning on of the pull up circuit 202 involves the pulling down of node h_or_z_n 203 and the pulling-up of node l_or_z 506. A major contributor to the pulling down of node h_or_z_n 203 is PFET transistor 512. As described above, the pull up impedance control code cb<8:1> 424 is used to control the capacitive loading of node h_or_z_n 203 by the capacitors in capacitor circuit 550 so as to compensate for changes in output resistance of PFET transistors, including PFET transistors 512. Additionally, referring to FIG. 2 and FIG. 3 in combination, code cb<8:1> 424 tracks voltage and temperature changes that also affect NMOS transistors, such as 308 and 310 which pull down on node h_or_z_n 203.

Referring back to FIG. 5, the slew-rate of the pulling-up of node l_or_z 506 is not well-controlled across PVT corners. However, NMOS transistor 528 contributes only about five percent of the pull up output current at node 520, so the contribution of this transistor to the transition is small. Thus, the lack of tight control has little effect on overall driver 110 functioning.

Turning-Off of the Pull Down Circuit

In DTL systems, turning off the pull down circuit 204 always launches a signal edge. Referring to FIG. 1, whenever one driver 110 is pulling down, there is some other driver pulling up. Thus, the current flows through a pull down circuit 204 whenever active. The cutting off of the current flow through the pull down circuit 204 launches a signal.

Referring to FIGS. 2 and 11, the outputs of multiplexor 240 drive the input nodes in_0 209 and in_1 211 going to pull down output unit 1108. Similarly, the outputs of multiplexor 250 drive the input node in_0_25 213 and in_1_25 215 going to pull down output unit 1106. Each system consisting of a multiplexor and a pull down input circuit can be represented by the circuit in FIG. 10 and 12 where the output of FIG. 10 is coupled to the input of FIG. 12. Thus, in_0 1202 and out_0_n 1050 are coupled together and in_1 1204 and out_1_n 1060 are coupled together.

Referring to FIG. 2 in combination with FIG. 10, the slew rate for the turning off of the pull down circuit 204 is controlled by controlling the slew rate of the pulling down of nodes in_0 209 in_1 211, in_0_25 213 and in_1_25 215. FIG. 10 shows a general multiplexor representing both multiplexors 240 and 250. Nodes in_0 209, in_1 211, in_025 213 and in_1_25 215 are referred to jointly herein after with node out_0_n 1050 and out_1_n 1060 in FIG. 10. Nodes in_0 209 and in_1 211 are pulled down by the NMOS transistors 1008, 1010, 1024, 1018, 1012 and 1014 of the circuit shown in FIG. 10. As PVT conditions change, the net output resistance of NMOS transistors 1008, 1010, 1024, 1018, 1012 and 1014 changes. The pull down impedance control code 207 tracks these changes because the output pull-down element 1208 consists of NMOS transistors. Therefore, the code 207 can be used to selectively increase or decrease the capacitive load on node in_0 209 and in_1 211, so that the "RC value" for the pulling down of each of these nodes remains fairly constant across PVT variations.

Referring to FIGS. 10, 11 and 12, the outputs, out_0_n 1050 and out_1_n 1060, are generalized representations of the inputs shown in FIG. 11, i.e., in_0 209, in_1 211, in_0_25 213, and in_1_25 215. As shown in FIG. 11 the first two inputs are coupled to pull down output circuit 1108, and the second set of inputs are coupled to pull down output circuit 1106. FIG. 12 shows a generic pull down output circuit 1200, representing both pull down output circuits 1108 and 1106. Accordingly, the four inputs discussed above are generically represented in FIG. 12 by inputs in_0 1202 and in_1 1204.

Referring to FIG. 11, 12 and 15, bit code 207, shown in FIG. 11, passes through slowing rate circuit 1104 and bit buffer circuit 1102, and becomes code cbd_s<8:1> 226. This code 226 is used in pull down capacitor circuits 1210 and 1250 to control the number of NMOS load capacitors 1510 that are connected to their respective input nodes. Node in_0 1202 is connected to the input of capacitor circuit 1210. As pull down NMOS PVT conditions become "slower", the number of control bits in code 226 that are high increases, which reduces the number of capacitors in capacitor circuit 1210 that are connected to in_0 1202. Therefore, as the resistance of the NMOS transistors pulling down in_0 1202 increases, the capacitive loading on in_0 1202 decreases, keeping the "RC" value for this transition fairly constant across PVT variations.

Referring to FIG. 12, node in_1 1204 is connected to the input of capacitor circuit 1250, and the loading placed on node 1204 is controlled in a manner similar to that for capacitor circuit 1210 and in_0 1202. An additional consideration for this node is that it is also connected to the inputs of the supplemental pull down cells in circuit 1230.

Referring to FIG. 12 and FIG. 13, as the pull down impedance control code 226 changes, the capacitive load that supplemental cells 1300 place on node in_1 1204 also changes. As PVT conditions change, the changes in capacitive loading that occur in capacitor circuit 1250 compensate for the loading changes due the supplemental cells 1300 as well as for changes in the resistance pulling down node in_1 1204.

Referring to FIG. 12 in combination with FIG. 11, when operating in 25-ohm pull-down mode, the pull-down output circuits 1106 and 1108 sink a substantial current of within 10% of 30 mA for this particular embodiment (a power supply with 1.5 volts in combination with a 25-ohm pull down). Therefore, too-rapid a tuning-off of the pull down circuit 204 could produce a very large "di/dt", and therefore, a large ground bounce. Therefore, pull down circuit 204 is designed to turn off fairly slowly in order to limit the "di/df" and , therefore, the size of the ground bounce. To accomplish this, transistor 1220 has a very long and narrow channel, making it very resistive. The discharging of a logic high voltage on node gt_pd2 1222 occurs through this resistive transistor 1220. Therefore, node gt_pd2 1222 falls very slowly, turning off transistor 1207 very slowly, keeping ground-bounce small.

To attain a linear ramping of current with time, thereby minimizing peak "di/dt", the turning-off of NMOS transistor 1206 and 1207 are initiated at somewhat different times and proceed at different rates. The tuning off of transistor 1207 begins later and occurs more slowly than that of transistor 1206.

Turning-On of the Pull Down Circuit

In general, in DTL systems, the turning on of a pull down circuit always launches a signal edge. Thus, referring to FIG. 12, the rate of turning on pull down circuit 204 is controlled by controlling the rate of pulling-up of nodes in_0 1202 and in__1 1204. This is accomplished in the same manner as the controlling of the rate of turning-off of the pull down circuit 204.

Nodes in__0 1202 and in__1 1204 are pulled up by the PMOS transistors 1022, 1002, 1004, 1006, 1016 and 1028 in the circuit shown in FIG. 10. The output resistance of transistors 1022, 1002, 1004, 1006, 1016 and 1028 changes with PVT variations. However, the pull down code 226, used in the adjustment of the capacitive loading on nodes in__0 1202 and in__1 1204 tracks PVT resistance variations in NMOS transistors more closely than in PMOS transistors. The PVT variations are similar between NMOS and PMOS transistors, but the process variations differ. The net result is that the slew rate for the turning on of the pull down circuit 204 is not quite as well-controlled as that for the turning off of the pull down circuit 204, but well-enough to achieve good overall performance. To attain a linear ramping of current with time, thereby minimizing peak "di/dt", the turning on of NMOS transistors 1206 and 1207 are initiated at somewhat different times and proceed at different rates. The turning on of transistor 1207 begins later and occurs more slowly than that of transistor 1206.

Logic Considerations

Referring back to FIG. 2 in combination with FIG. 11, with the exception of sel_data_n 260, which determines whether the multiplexors 230, 240, and 250 accept data inputs or test inputs, a plurality of control signals, including signals up_open 208 and down_25 210 affect only the outputs of the flip flop circuits (not shown) within control circuit 222. Referring to FIGS. 1 and 2, in general, when oe 220 is high, driver 110 is in data driving mode; and when oe 220 is low, driver 110 is in data receiving mode. In data receiving mode, if up_open 208 is low, driver 110 terminates received signals. If up_open is high, driver 110 presents a high impedance to the output and reflects received signals. In data driving mode, when the pull down impedance is intended to be 25 ohms, input down_25 210 is set high. When the pull down impedance is intended to be 50 ohms, input down_25 210 is set low, and control circuit 222 functions to tri-state pull-down output unit 1106. The signal up_open 208 affects the output 206 only if oe 220 is low. I such case, if up_open 208 is low, pull up circuit 202 is active (i.e. couples the output 206 to VDDO) and the pull down circuit 204 presents a high impedance to the output node 206. When up_open is high and oe 220 is low, both pull up circuit 202 and pull down circuit 204 are inactive (i.e. presenting a high impedance to output 206).

Other Embodiments

Other embodiments are within the following claims. For example, one of ordinary skill in the art appreciates that the stated limits are approximations and a function of tolerances in power supply variation, in the number of supplemental bits employed, and a host of other factors affecting that the driver herein disclosed. Further, one of ordinary skill in the art will appreciate that the driver circuitry may be implemented in a complementary fashion whereby N-channel transistors are replaced with P-channel transistors and vice versa, where appropriate.

Additionally, the driver alternatively includes either or both slew rate control circuitry and impedance control circuitry within the driver.

Additionally, one skilled in the art appreciates that components within both the pull up circuit 202 and the pull down circuit 204 may optionally be represented by multiplexors.

In one embodiment, for example, pull up circuit 202 and pull down circuit 204 are represented by multiplexors wherein a control signal determines whether a data input or a test input controls the output of the pull up and pull down circuits 202 and 204. In another embodiment, components within both the pull up circuit 202 and the pull down circuit 204 are represented by inverting multiplexors.

In the present invention, a transistor may be conceptualized as having a control terminal which controls the flow of current between a first current handling terminal and a second current handling terminal. An appropriate condition on the control terminal causes a current to flow from/to the first current handling terminal and to/from the second current handling terminal. In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current exiting the base causes an emitter-to-collector current to flow.

A MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equations merely refers to whichever diffusion (drain or source) has the lower voltage at any given time. For example, the "source" of an N channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

What is claimed is:

1. A method for providing control of a slew rate of a driver, the driver capable of launching signals at a driving end of a transmission line and of terminating signals at a receiver end of the transmission line, the driver having an output voltage and an impedance control system, the driver coupled to the transmission line and the driver coupled to a first supply voltage, the method controlling the slew rate of the driver across process, voltage, and temperature (PVT) variations, the method comprising:

establishing a RC time constant for a voltage transition of a number of output elements, the number of output elements controlling a launching of a signal;

controlling the RC time constant associated with the number of output elements across a plurality of PVT variations by adjusting the number of output elements controlling the launching of the signal;

providing the circuit with a pull up circuit, the pull up circuit receiving an input signal and providing an output signal, the pull up circuit including the first subset of the number of output elements; and providing the circuit with a pull down circuit having an impedance, the pull down circuit receiving the input signal and the pull down circuit including the second subset of the number of output elements.

2. (Amended) The method of claim 1 further comprising:

controlling a plurality of slew rates of a plurality of switches for the number of output elements by controlling a time constant of each of the plurality of switches.

3. The method of claim 1 further comprising:

sizing the number of output elements to account for a predetermined range of PVT conditions.

4. The method of claim 2 wherein the plurality of switches are pass gate nodes.

5. The method of claim 1 further comprising:

controlling a net capacitance loading a node via a plurality of switches.

6. The method of claim 1 further comprising:

controlling a net resistance driving a net capacitance, the net capacitance loading a node via selectively enabling of one or more transistors coupled to the node.

7. The method of claim 1 wherein the driver receives a control code, the control code selectively enabling and disabling the number of output elements to control an output impedance of the driver, the output impedance determining an output slew rate.

8. The method of claim 7 wherein the selectively enabling and disabling the number of output elements according to the control code compensates for variations in the output impedance due to PVT variations.

9. The method of claim 7 wherein the selectively enabling and disabling of the number of output elements causes a direct current (DC) impedance of a parallel combination of the number of output elements to be within a predetermined percentage of the impedance of the transmission line.

10. The method of claim 1 further comprising:

providing a number of output elements responsive to a control code, the number of output elements including a first subset of the number of output elements and a second subset of the number of output elements; and sizing a plurality of components coupled to the number of output elements, the sizing of the plurality of components contributing to the control of the slew rate.

11. The method of claim 10 further comprising:

in the plurality of components, including a first plurality of transistors and a second plurality of transistors; and sizing the first plurality of transistors to present a capacitive load substantially equal to the second plurality of transistors.

12. The method of claim 1 wherein each output element includes two or more transistors.

* * * * *

UNITED STATES PATENT AND TRADEMARK OFFICE
CERTIFICATE OF CORRECTION

PATENT NO.    : 6,297,677 B1
DATED         : October 2, 2001
INVENTOR(S)   : Ang et al.

It is certified that error appears in the above-identified patent and that said Letters Patent is hereby corrected as shown below:

<u>Column 27,</u>
Line 11, delete "(Amended)"

Signed and Sealed this

Sixth Day of May, 2003

JAMES E. ROGAN
*Director of the United States Patent and Trademark Office*